United States Patent
Matsuda et al.

(10) Patent No.: US 6,552,608 B2
(45) Date of Patent: Apr. 22, 2003

(54) LINEAR AMPLIFIER

(75) Inventors: Ayanori Matsuda, Sapporo (JP); Yutaka Saito, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/953,644

(22) Filed: Sep. 17, 2001

(65) Prior Publication Data

US 2002/0153948 A1 Oct. 24, 2002

(30) Foreign Application Priority Data

Apr. 18, 2001 (JP) .................. 2001-120311

(51) Int. Cl.[7] .................................... H03F 3/66
(52) U.S. Cl. ............................ 330/52; 330/151
(58) Field of Search ...................... 330/52, 151, 149, 330/129; 375/296, 297

(56) References Cited

U.S. PATENT DOCUMENTS 5,130,663 A * 7/1992 Tattersall, Jr. ............ 330/151
5,477,187 A * 12/1995 Kobayashi et al. ........ 330/151
5,610,554 A * 3/1997 Anvari ...................... 330/151
6,232,838 B1 * 5/2001 Sugimoto .................. 330/149
6,340,914 B1 * 1/2002 Gavrilovic ................. 330/151

FOREIGN PATENT DOCUMENTS

| JP | 09-172380 | 6/1997 |
| JP | 09-307359 | 11/1997 |
| JP | 11-355057 | 12/1999 |
| JP | 2000-183763 | 6/2000 |

* cited by examiner

Primary Examiner—Tuan T. Lam
(74) Attorney, Agent, or Firm—Katten Muchin Zavis Rosenman

(57) ABSTRACT

The present invention relates to a linear amplifier for amplifying power of a radio-frequency signal whose level varies widely, based on feed-forward technique. The linear amplifier according to the present invention is given in advance appropriate transfer characteristics for an error elimination loop and an error detection loop and these appropriate transfer characteristics are applied at a starting time. Therefore, performance and total reliability of equipment to which the present invention is applied are enhanced and cost reduction thereof is realized.

22 Claims, 17 Drawing Sheets

FIG. 5

| LEVEL L | ATTENUATION $ATT_{ed}$ | PHASE-SHIFT $\Phi_{ed}$ | ATTENUATION $ATT_{es}$ | PHASE-SHIFT $\Phi_{es}$ |
|---|---|---|---|---|
| L1 | | | | |
| L2 | | | | |
| ... | ... | ... | ... | ... |

| TEMPRATURE T | ATTENUATION $ATT_{ed}$ | PHASE-SHIFT $\Phi_{ed}$ | ATTENUATION $ATT_{es}$ | PHASE-SHIFT $\Phi_{es}$ |
|---|---|---|---|---|
| ... | ... | ... | ... | ... |

| DIFFERENCE | CORRECTION VALUE $\Delta \hat{a}_{ed}$ | CORRECTION VALUE $\Delta \hat{\phi}_{ed}$ | CORRECTION VALUE $\Delta \hat{a}_{es}$ | CORRECTION VALUE $\Delta \hat{\phi}_{es}$ |
|---|---|---|---|---|
| ... | ... | ... | ... | ... |

| DIFFERENCE | CORRECTION VALUE $\Delta \hat{a}_{ed}$ | CORRECTION VALUE $\Delta \hat{\phi}_{ed}$ | CORRECTION VALUE $\Delta \hat{a}_{es}$ | CORRECTION VALUE $\Delta \hat{\phi}_{es}$ |
|---|---|---|---|---|
| ... | ... | ... | ... | ... |

~34

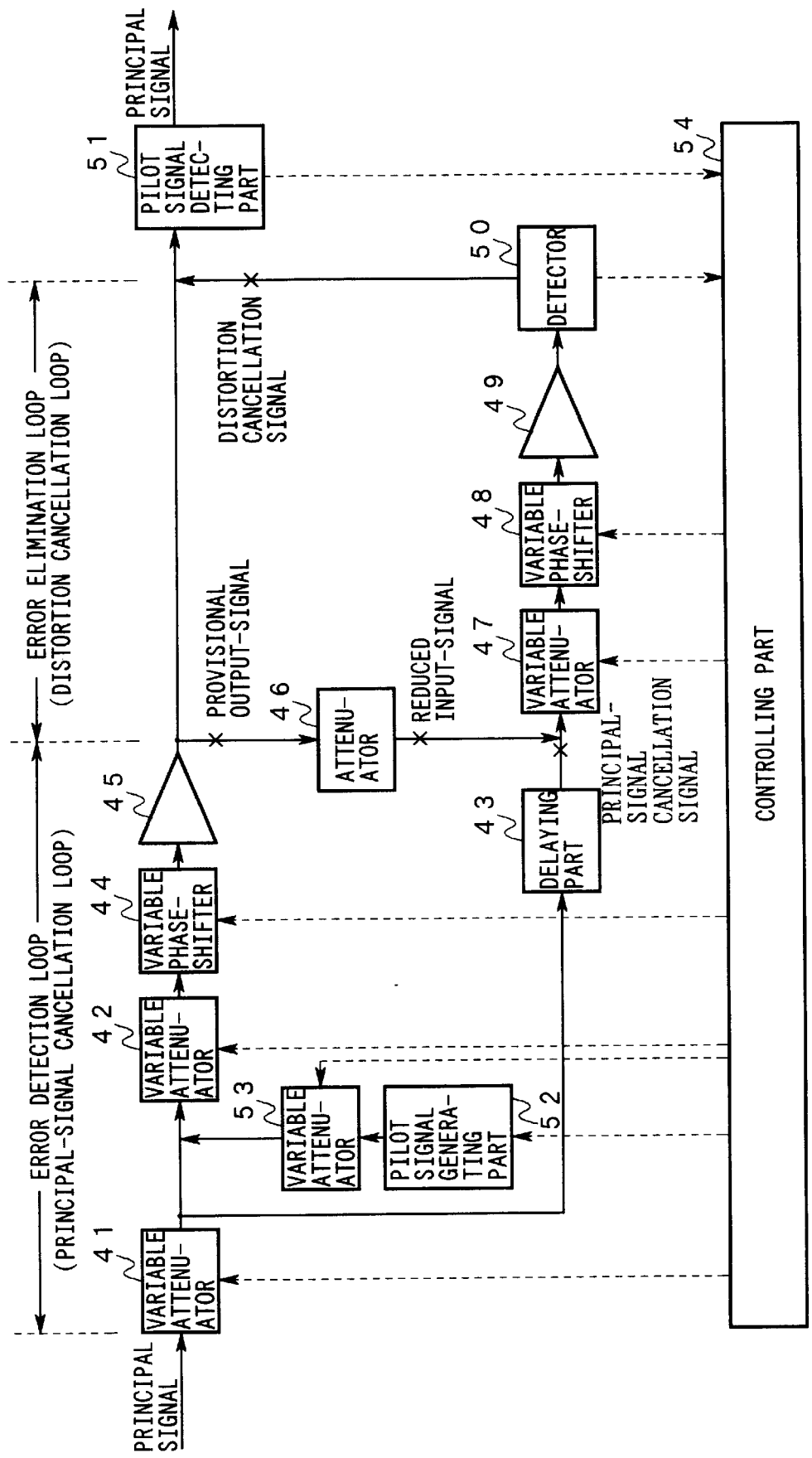

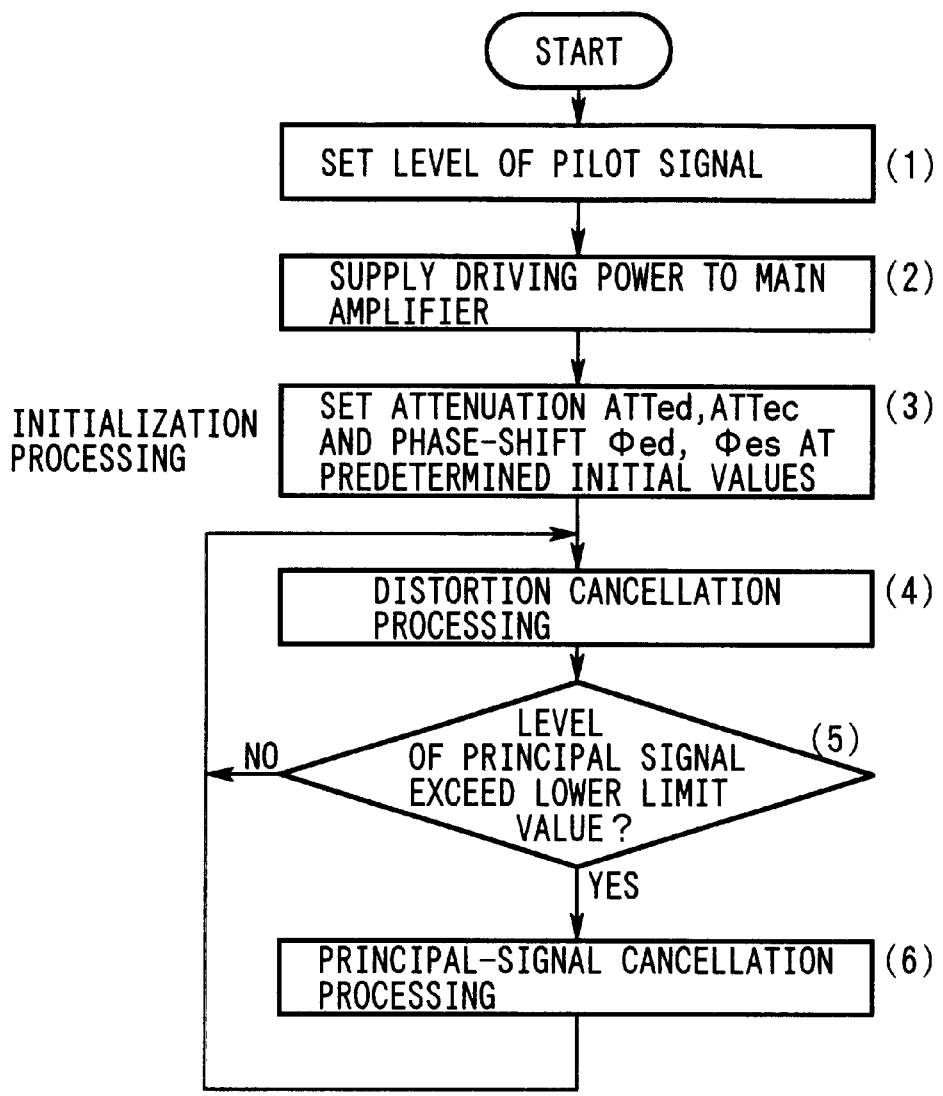
PRIOR ART FIG. 17

LINEAR AMPLIFIER

BACKGROUND OF THE INVENTION

1. Field of the Invention

The present invention relates to a linear amplifier for amplifying power of a radio-frequency signal whose level varies widely, based on feed-forward technique.

2. Description of the Related Art

In recent years, a CDMA (Code Division Multiple Access) has been applied to many mobile communication systems since it has characteristics that it has a high ability of keeping confidentiality and is not easily influenced by selective fading and other interference/jamming in a radio transmission path and also since technology of realizing transmitting power control which is indispensable for solving a near-far problem which is peculiar to it has been established.

Wireless zones of these mobile communication systems are formed, via redundantly structured power amplifiers and directional antennas, as a plurality of sector cells having the following advantages.

- to be able to reduce interferences of the same channel and improve utilization efficiency of radio frequencies based on directivity of the antennas
- to be able to have a large number of co-callers (number of subscribers) per unit frequency compared with that in omni-zones
- to be able to perform channel control (including transmitting power control) independently for each sector Feed-forward technique is also applied to many of the power amplifiers described above.

FIG. 16 is a diagram showing a structure example of the power amplifier to which the feed-forward technique is applied.

In the drawing, an input of a variable attenuator 41 is given an input signal whose power is to be amplified (hereinafter referred to as a 'principal signal') and an output of the variable attenuator 41 is connected to inputs of a variable attenuator 42 and a delaying part 43. An output of the variable attenuator 42 is connected to an input of a main amplifier 45 via a variable phase-shifter 44 and an output of the main amplifier 45 is connected to an input of the attenuator 46. Outputs of the delaying part 43 and the attenuator 46 are connected to an input of a variable attenuator 47 and an output of the variable attenuator 47, as well as the output of the main amplifier 45, is connected to an input of a pilot signal detecting part 51 via a variable phase-shifter 48, an auxiliary amplifier 49, and a detector 50. To the input of the variable attenuator 42, an output of a pilot signal generating part 52 is connected via a variable attenuator 53 and to control inputs of the variable attenuators 41, 42, 47 and the variable phase-shifters 44, 48 as well as control inputs of the pilot signal generating part 52 and the variable attenuator 53, corresponding output ports of a controlling part 54 are connected. Monitor outputs of the detector 50 and the pilot signal detecting part 51 are connected to corresponding input ports of the controlling part 54 and in an output of the pilot signal detecting part 51, the principal signal to be transmitted as a transmission wave is obtained.

Note that a loop-shaped circuit which is formed between the output of the variable attenuator 41 and the input of the variable attenuator 47 is hereinafter referred to as an 'error detection loop' (a principal-signal cancellation loop) and a loop-shaped circuit which is formed between the output of the main amplifier 45 and the input of the pilot signal detecting part 51 is referred to as an 'error elimination loop' (a distortion cancellation loop).

Operations of the power amplifier as structured above in its steady state are explained below.

The variable attenuator 41 is given by the controlling part 54 attenuation which is determined under the channel control (may include the transmitting power control) and applies to each of the variable attenuator 42 and the delaying part 43 the principal signal at a level at which predetermined transmitting power is achieved.

The pilot signal generating part 52 constantly generates a sine wave signal (hereinafter referred to as a 'pilot signal') with a known frequency outside an occupied bandwidth of the principal signal and applies the pilot signal at a predetermined level to the input of the variable attenuator 42 via the variable attenuator 53 whose attenuation is set by the controlling part 54.

The main amplifier 45 gives to the attenuator 46 a signal obtained by amplifying the principal signal and the pilot signal which are applied via the variable attenuator 42 and the variable phase-shifter 44 (hereinafter referred to as a 'provisional output-signal'). The attenuator 46 has attenuation equal to an inverse number of a nominal value of a total gain of the variable attenuator 42, the variable attenuator 44, and the main amplifier 45 which are cascaded and generates a signal corresponding to the sum of the principal signal inputted to the variable attenuator 42 and the pilot signal (hereinafter referred to as a 'reduced input-signal').

Delay time of the delaying part 43 is set in advance at a value equal to a sum (difference) of a nominal value of total propagation delay time of the variable attenuator 42, the variable phase-shifter 44, the main amplifier 45, and the attenuator 46 which are cascaded and time corresponding to a half of a cycle of the principal signal.

The delaying part 43 delays the principal signal outputted by the variable attenuator 41 over this delay time to output a signal whose phase is 180 degrees ahead of (delayed behind) the reduced input-signal which is obtained in the output of the attenuator 46 (hereinafter referred to as a 'principal-signal cancellation signal').

The variable attenuator 47, the variable phase-shifter 48, the auxiliary amplifier 49, and the detector 50 vary a level and a phase of a signal which is given as a sum string of instantaneous values of the reduced input-signal and the principal-signal cancellation signal under control of the controlling part 54 to generate a 'distortion cancellation signal'.

The detector 50 extracts and detects a component of the principal signal included in the distortion cancellation signal to detect a level of the component of the principal signal.

Furthermore, the pilot signal detecting part 51 outputs a signal which is given as a sum of the provisional output-signal and the distortion cancellation signal and detects a level of a component of the pilot signal included in the signal.

Meanwhile, the controlling part 54 sets at a starting time a level of the pilot signal which is applied to the variable attenuator 42 by setting the aforesaid attenuation for the variable attenuator 53 (FIG. 17(1)) and supplies driving power to the main amplifier 45 via a power controlling part which is not shown (FIG. 17(2)).

The controlling part 54 also performs processing (hereinafter referred to as 'initialization processing') of setting attenuation $ATT_{ed}$, $ATT_{es}$ of the variable attenuators 42, 47 and phase-shift $\Phi_{ed}$, $\Phi_{es}$ of the variable phase-shifters 44, 48 at predetermined initial values (here to simplify the explanation, supposed to be a digital value X (a positive pure binary number) at which the attenuation/the phase-shift become a mean value) (FIG. 17(3)).

After finishing the initialization processing, the controlling part 54 updates the attenuation $ATT_{es}$ of the variable attenuator 47 and the phase-shift $\Phi_{es}$ of the variable phase-shifter 48 at a predetermined frequency based on an adaptive algorithm for minimizing the level of the pilot signal which is detected by the pilot signal detecting part 51 (FIG. 17(4)). Note that processing of updating the attenuation $ATT_{es}$ of the variable attenuator 47 and the phase-shift $\Phi_{es}$ of the variable phase-shifter 48 in this way is hereinafter referred to simply as 'distortion cancellation processing'.

Furthermore, after finishing the distortion cancellation processing, the controlling part 54 discriminates whether or not the level of the principal signal detected by a principal-signal detecting part (not shown) which is provided as a part of the pilot signal detecting part 51 exceeds a predetermined lower limit value (FIG. 17(5)) and as long as the result of the discrimination is false, it repeats the distortion cancellation processing without performing 'principal-signal cancellation processing' which is described later.

However, when the result of the discrimination is true, the controlling part 54 performs, in addition to the distortion cancellation processing, processing of updating the attenuation $ATT_{ed}$ of the variable attenuator 42 and the phase-shift $\Phi_{ed}$ of the variable phase-shifter 44 (hereinafter referred to as 'principal-signal cancellation processing') based on an adaptive algorithm for minimizing the level of the principal signal detected by the detector 50 (FIG. 17(6)).

Therefore, since components of the principal signals included in the reduced input-signal and the principal-signal cancellation signal are maintained in a state in which their amplitude is equal to each other and their phases are different by 180 degrees from each other, the variable attenuator 47 is fed the following components included in the reduced input-signal.

the component of the pilot signal
a component of distortion which is generated by the main amplifier 45 according to the principal signal Furthermore, since the following components included in the provisional output-signal and the distortion cancellation signal are maintained in a state in which their amplitude is equal to each other and their phases are different by 180 degrees from each other, the input of the pilot signal detecting part 51 is fed the principal signal in which the component of the distortion generated by the main amplifier 45 is suppressed.

the component of the pilot signal
the component of the distortion which is generated by the main amplifier 45 according to the principal signal Therefore, even when the attenuation set for the variable attenuator 41 by the controlling part 54 varies widely, the principal signal at a predetermined level consistent with the attenuation is obtained as a transmission wave without having a spurious.

Incidentally, in the conventional example described above, an amplitude characteristic and a phase characteristic of the power amplifier may possibly change depending not only on the structure of a circuit of the power amplifier but also on conditions (power of signals and environments) under which the power amplifier is in actual operation. Moreover, the amplitude characteristic and the phase characteristic may possibly shift or fluctuate in actual operational processes even when central values of the attenuation of the variable attenuators 42, 47 and the phase-shift of the variable phase-shifters 44, 48 are adjusted in advance to be optimum values when it is manufactured.

In the conventional example, in order to avoid occurrence of failures due to the shift and the fluctuation, the levels of the pilot signal and the principal signal are set at optimum values while sufficient time is taken to vary the attenuation of the variable attenuators 53, 41 in a perturbation process which is carried out at the starting time.

However, since there is a technical limit in shortening time required for the perturbation at the starting time, there is a high possibility that time required for substituting a standby system for an active system under a redundant structure, for example, in an n+1 stand-by system is not able to be shortened.

Furthermore, when the power amplifier is started at a high speed exceeding the limit in shortening the time required for the perturbation, the attenuation and the phase-shift which are set respectively for the variable attenuators and the variable phase-shifters may possibly have large deviations relative to the central values of the attenuation and phase-shift value ranges.

Therefore, in the perturbation process, the attenuation and the phase-shift are temporarily set at minimum values which are not the optimum values, and since a long time is taken for them to settle in the actual optimum values or they are maintained at the minimum values without settling in the optimum values, an excessively large level of distortion (the spurious) may possibly be generated.

Moreover, the pilot signal generating part 52 constantly generates the pilot signal irrespective of the attenuation of the variable attenuator 41 (the level of the inputted principal signal) so that even when the level of the principal signal inputted to the main amplifier 45 is low enough for a level of the distortion generated in the main amplifier 45 to be permissible, the component of the pilot signal is transmitted as the spurious and average power consumption is increased.

SUMMARY OF THE INVENTION

It is an object of the present invention to provide a linear amplifier which realizes cost reduction of a system and equipment to which it is applied and highly maintain their performance and reliability.

It is another object of the present invention to maintain linearity with high reliability immediately after it is started.

It is still another object of the present invention to achieve a high starting speed with high reliability and stably maintain the predetermined performance.

It is yet another object of the present invention to reduce running cost and enhance performance.

It is yet another object of the present invention to realize flexible adaptability to fluctuation in characteristics which may possibly occur due to changes in environmental conditions and aging and to highly maintain linearity.

It is yet another object of the present invention to realize flexible adaptability to fluctuation in characteristics and deviations and highly maintain linearity.

It is yet another object of the present invention to realize flexible adaptability to fluctuation in characteristics which may possibly occur due to changes in environmental conditions and aging and to highly maintain linearity.

It is yet another object of the present invention to highly maintain linearity while maintaining flexible adaptability to changes in environmental conditions.

It is yet another object of the present invention to stably and highly maintain linearity.

It is yet another object of the present invention to maintain stable performance.

It is yet another object of the present invention to realize flexible adaptability to equipment of various level diagrams.

It is yet another object of the present invention to enhance total reliability as well as realize cost reduction of equipment to which the above inventions are applied.

The above objects are achieved by a linear amplifier which is characterized in that appropriate transfer characteristics for an error elimination loop and an error detection loop are given in advance and the appropriate transfer characteristics are applied at a starting time.

In the linear amplifier as described above, time required for the error detection loop and the error elimination loop to shift to their steady states at the starting time is shortened.

The above objects are also achieved by a linear amplifier which is characterized in that appropriate transfer characteristics for an error elimination loop and an error detection loop are given in advance and the appropriate transfer characteristics are applied when a rate of change in a level of an inputted or an outputted principal signal exceeds a predetermined threshold.

In the linear amplifier as described above, even when the level of the principal signal increases/decreases abruptly, the error detection loop and the error elimination loop are capable of shifting promptly to their steady states which are appropriate for a new level of the principal signal.

The above objects are also achieved by a linear amplifier which is characterized in that initial values are determined as values at which a level of a pilot signal obtained in an output of the error detection loop becomes minimum, the initial values being initial values for each of a plurality of items whose cross-correlation is low and which gives transfer characteristics of an error detection loop, and the detecting done by scanning at a starting time while values of other items are fixed at predetermined values. The linear amplifier is also characterized in that an error elimination loop and a combination of the initial values are applied as appropriate transfer characteristics.

In the linear amplifier as described above, the transfer characteristics of the error detection loop and the error elimination loop are flexibly initialized at values consistent with actual characteristics at the starting time even when environmental conditions and a characteristic of each part may possibly change in a wide range.

The above objects are also achieved by a linear amplifier which is characterized in that injection of a pilot signal to an error detection loop is restricted during a period in which a level of a principal signal to be amplified is lower than a predetermined lower limit value.

In the linear amplifier as described above, when the level of the principal signal is low enough for a characteristic thereof to be considered to be linear, the pilot signal is prevented from being outputted as a spurious as well as power required for generating and superimposing the pilot signal is prevented from being consumed even when no support for discriminating the level is given by external equipment.

The above objects are also achieved by a linear amplifier which is characterized in that, according to a notice indicating a period in which a level of a principal signal to be amplified is lower than a predetermined lower limit value, injection of a pilot signal to an error detection loop is restricted during the period.

In the linear amplifier as described above, when the level of the principal signal is low enough for a characteristic thereof to be considered to be linear, the pilot signal is prevented from being outputted as a spurious as well as power required for generating and superimposing the pilot signal is prevented from being consumed as long as the level is surely recognized as the notice.

The above objects are also achieved by a linear amplifier which is characterized in that appropriate transfer characteristics which are actually set are recorded and reused.

In the linear amplifier as described above, transfer characteristics to be set for an error detection loop and an error elimination loop at a starting time or when a level of a principal signal changes abruptly are given as the actually appropriate transfer characteristics.

The above objects are also achieved by a linear amplifier which is characterized in that it comprises means for monitoring a level of a principal signal and means for storing transfer characteristics to be set for an error detection loop and an error elimination loop according to the level(s) of the principal signal, and the transfer characteristics corresponding to the level(s) of the actually monitored principal signal are applied as an appropriate transfer characteristic for the error detection loop and/or an appropriate transfer characteristic for the error elimination loop.

In the linear amplifier as described above, the transfer characteristics to be set for the error detection loop and the error elimination loop at a starting time or when the level of the principal signal changes abruptly are given as the transfer characteristics flexibly appropriate for the level even when linearity of an amplifying section varies according to the level of the principal signal.

The above objects are also achieved by a linear amplifier which is characterized in that appropriate transfer characteristics which are actually set are recorded according to a 'monitored level' and they are reused.

In the linear amplifier as described above, transfer characteristics to be set for an error detection loop and an error elimination loop at a starting time or when a level of a principal signal changes abruptly are given as the actually appropriate transfer characteristics even when linearity varies according to the level of the principal signal.

The above objects are also achieved by a linear amplifier which is characterized in that it comprises means for monitoring a temperature and means in which transfer characteristics to be set for an error detection loop and an error elimination loop according to the monitored temperature are stored, and the transfer characteristics corresponding to the actually monitored temperature are applied as an appropriate transfer characteristic for the error detection loop and/or an appropriate transfer characteristic for the error elimination loop.

In the linear amplifier as described above, even when linearity varies according to the temperature as well as the level of the principal signal, the error detection loop and the error elimination loop are capable of maintaining their steady states with high reliability and stability while maintaining adaptability to deviations of the linearity.

The above objects are also achieved by a linear amplifier which is characterized in that appropriate transfer characteristics which are set for an error detection loop and an error elimination loop are recorded according to a 'monitored temperature' and they are reused.

In the linear amplifier as described above, transfer characteristics to be set for the error detection loop and the error elimination loop at a starting time or when a level of a principal signal changes abruptly are given as the actually appropriate transfer characteristics even when linearity varies according to the temperature.

The above objects are also achieved by a linear amplifier which is characterized in that 'appropriate transfer characteristics' are applied in place of new transfer characteristics to be updated, when deviations of the new transfer characteristics relative to 'appropriate transfer characteristics' exceed predetermined upper limit values.

In the linear amplifier as described above, when an error detection loop and an error elimination loop deviate from or may possibly deviate from their steady states due to some cause under adaptive control, the transfer characteristics of the error detection loop and the error elimination loop are initialized to the appropriate transfer characteristics promptly.

The above objects are also achieved by a linear amplifier which is characterized in that it comprises means for setting a level of a principal signal at a low value at which 'distortion occurring in an amplification element' is reduced, during a period in which each of the initial values of a plurality of items are obtained.

In the linear amplifier as described above, decrease in accuracy of the initial values which is caused because the amplification element operates in an excessively nonlinear region is prevented.

The above objects are also achieved by a linear amplifier which is characterized in that a level of a principal signal given from outside is set at a low value at which 'distortion occurring in an amplification element' is reduced, during a period in which individual initial values of a plurality of items are obtained.

In the linear amplifier as described above, decrease in accuracy of the initial values which is caused because the amplification element operates in an excessively nonlinear region is prevented.

The above objects are also achieved by a linear amplifier which is characterized in that it comprises means for storing in advance correction values to be applied in correcting: a difference between levels of the principal signals amplified by the amplifying section, the difference which could occur between a level during the period in which the individual initial values of the plurality of items are obtained by the controlling section and a level after the period is over; and a margin between errors in the transfer characteristics of the error detection loop and the error elimination loop which occur individually according to the difference in the levels and a characteristic of the amplifying section. And, the initial values of the plurality of items according to an actual value of the difference in the levels are corrected, by using the correction values which are stored in the correction value storage section.

In the linear amplifier as described above, initial values of the transfer characteristics of the error detection loop and the error elimination loop are set at appropriate values with high reliability irrespective of the level of the principal signal after the period in which the individual initial values of the plural items are obtained by a controlling part is over.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 5 is a table showing the composition of an initial value table in the first embodiment of the present invention;

FIG. 9 is a table showing another composition of the initial value table to be applied to the embodiment shown in FIG. 8;

FIG. 14 is a table (1) showing the composition of a first correction value table to be applied to the fourth embodiment of the present invention;

FIG. 15 is a table (2) showing the composition of a second correction value table to be applied to the fourth embodiment of the present invention;

FIG. 16 is a diagram showing a structure example of a power amplifier to which feed-forward technique is applied; and FIG. 17 is a flow chart of operations in a controlling part in a conventional example.

DESCRIPTION OF THE PREFERRED EMBODIMENTS

Principles of a linear amplifier according to the present invention are first explained with reference to FIG. 1.

Figure 1:
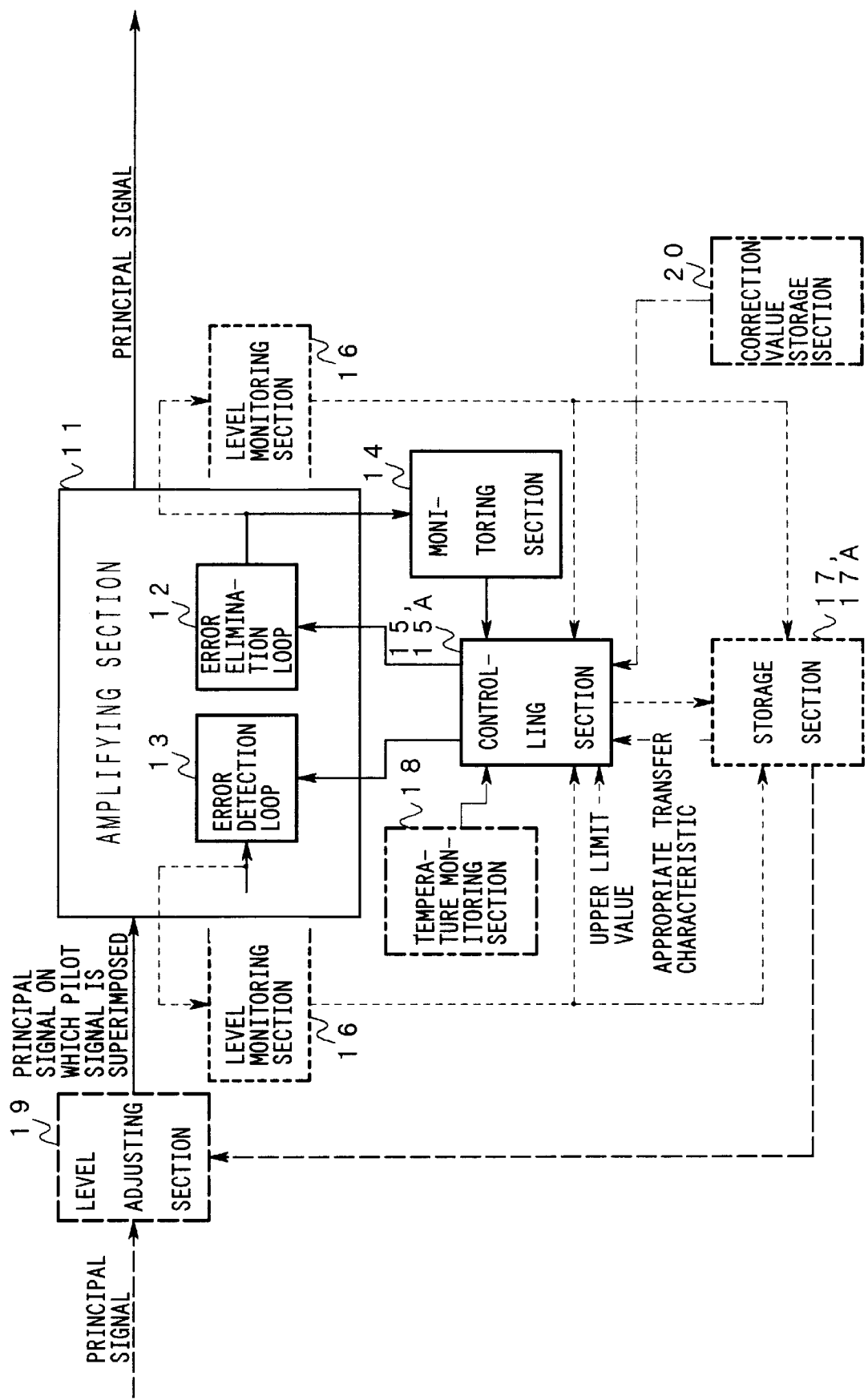
FIG. 1 is a block diagram showing a first principle of a linear amplifier according to the present invention.

FIG. 1 is a diagram showing a first principle of the linear amplifier according to the present invention.

The linear amplifier shown in FIG. 1 is composed of an amplifying section 11 including an error elimination loop 12 and an error detection loop 13, a monitoring section 14, controlling sections 15 and 15A, a level monitoring section 16, storage sections 17, 17A, a temperature monitoring section 18, a level adjusting section 19, and a correction value storage section 20.

A principle of a first linear amplifier according to the present invention is described as follows.

The amplifying section 11 amplifies a principal signal on which a pilot signal with a known frequency is superimposed and linearity thereof is maintained based on feed-forward technique. The monitoring section 14 extracts a component of the pilot signal which is included as a distortion component at an output end of the error elimination loop 12 which is included in the amplifying section 11. The controlling section 15 is given in advance appropriate transfer characteristics for the error elimination loop 12 and the error detection loop 13 included in the amplifying section 11. Furthermore, at a starting time, the controlling section 15 applies the appropriate transfer characteristics and updates the transfer characteristics under adaptive control which minimizes a level of the pilot signal which is extracted by the monitoring section 14.

In other words, time required for the error detection loop 13 and the error elimination loop 12 to shift to their steady states at the starting time is shortened.

Therefore, the amplifying section 11 is capable of linear-amplifying the principal signal with high reliability immediately after it is started.

A principle of a second linear amplifier according to the present invention is described as follows.

The controlling section 15A applies the appropriate transfer characteristics mentioned above when a rate of change in a level of the principal signal outputted by the amplifying section 11 exceeds a predetermined threshold and updates the transfer characteristics under the adaptive control which minimizes the level of the pilot signal which is extracted by the monitoring section 14.

In other words, even when the level of the principal signal increases/decreases abruptly, the error detection loop 13 and the error elimination loop 12 are capable of shifting promptly to their steady states which are appropriate for a new level of the principal signal.

Therefore the linearity of the amplifying section 11 is maintained with high reliability and stability.

A principle of a third linear amplifier according to the present invention is described as follows.

The controlling sections 15 and 15A determine initial values for each of a plurality of items whose cross-correlation is low and which gives the transfer characteristics of the error detection loop 13 and the error elimination loop 12 as a value at which the level of the pilot signal extracted by the monitoring section 14 becomes minimum, by scanning each of the initial values while fixing values of other items at predetermined values, and apply a combination of the initial values as the appropriate transfer characteristics.

In other words, the transfer characteristics of the error detection loop 13 and the error elimination loop 12 are flexibly initialized at values consistent with actual characteristics at the starting time even when environmental conditions and a characteristic of each part may possibly change in a wide range.

Therefore, a starting speed is increased with high reliability and predetermined performance is stably maintained.

Figure 2:
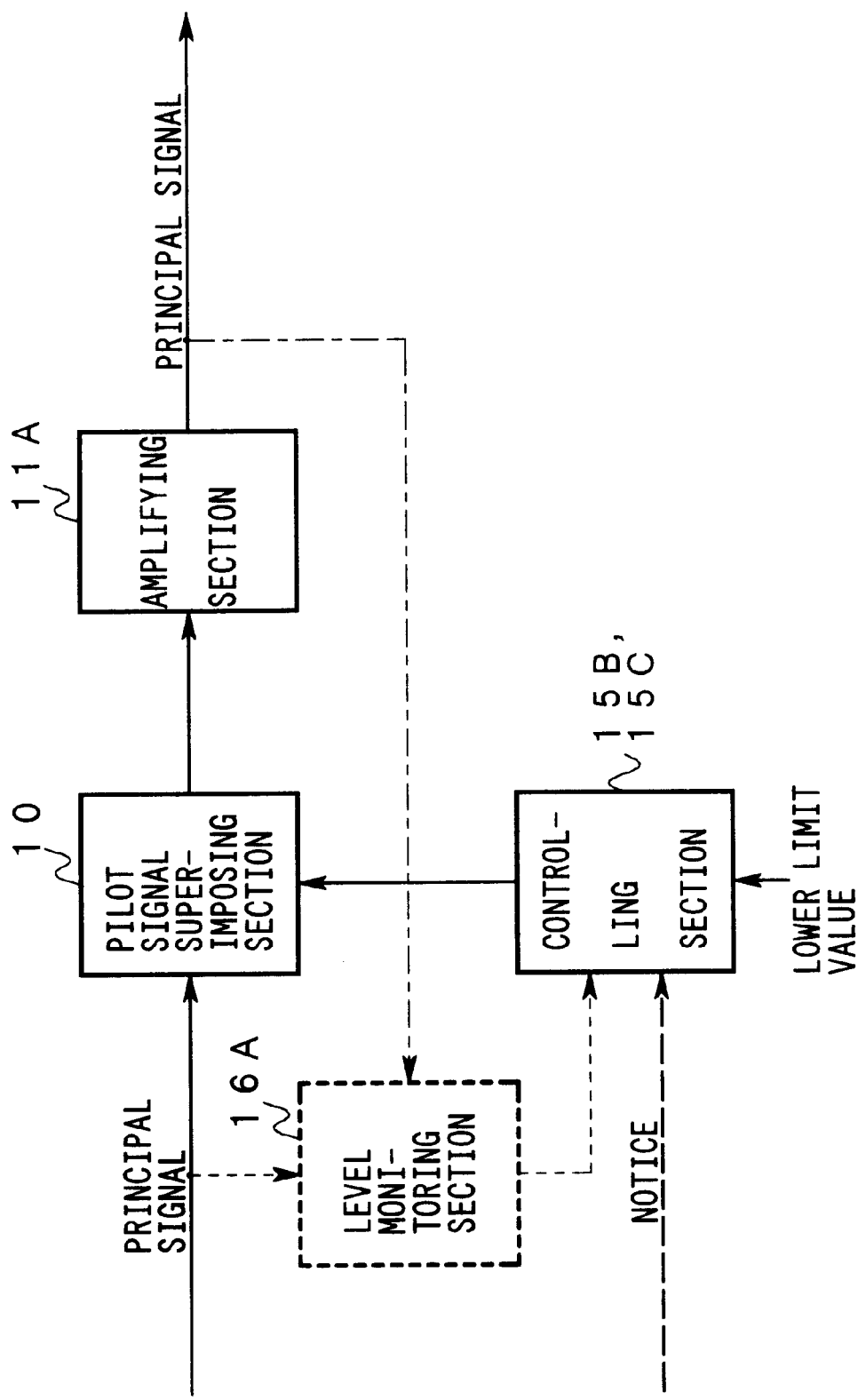
FIG. 2 is a block diagram showing a second principle of the linear amplifier according to the present invention.

FIG. 2 is a block diagram of a second principle of the linear amplifier according to the present invention.

The linear amplifier shown in FIG. 2 is composed of a pilot signal superimposing section 10, an amplifying section 11A, controlling sections 15B, 15C, and a level monitoring section 16A.

A principle of a fourth linear amplifier according to the present invention is described as follows.

The pilot signal superimposing section 10 superimposes the pilot signal with the known frequency on the inputted principal signal. The amplifying section 11A amplifies the principal signal on which the pilot signal is superimposed in this way and which maintains linearity based on the feed-forward technique, under the adaptive control which minimizes the component of the pilot signal obtained at the output end thereof. The controlling section 15B restricts the superimposition of the pilot signal done by the pilot signal superimposing section 10 during a period in which the level of the principal signal monitored by the level monitoring section 16A is lower than a predetermined lower limit value.

In other words, when the level of the principal signal is low enough for a characteristic of the amplifying section 11A to be considered to be linear, the pilot signal is prevented from being outputted as a spurious as well as power required for generating and superimposing the pilot signal is prevented from being consumed even when no support for discriminating the level is given by external equipment.

Therefore, running cost is reduced and performance is enhanced.

A principle of a fifth linear amplifier according to the present invention is described as follows.

The pilot signal superimposing section 10 superimposes the pilot signal with the known frequency on the inputted principal signal. The amplifying section 11A amplifies the principal signal on which the pilot signal is superimposed in this way and which maintains linearity based on the feed-forward technique, under the adaptive control which minimizes the component of the pilot signal obtained at the output end thereof.

According to a notice indicating the period in which the level of the inputted principal signal is lower than the predetermined lower limit value, the controlling section 15C restricts the superimposition of the pilot signal done by the pilot signal superimposing section 10 during the period.

In other words, when the level of the principal signal is low enough for the characteristic of the amplifying section 11A to be considered to be linear, the pilot signal is prevented from being outputted as the spurious as well as the power required for generating and superimposing the pilot signal is prevented from being consumed as long as the level is surely recognized as the notice.

Therefore, running cost is reduced and performance is enhanced.

A principle of a sixth linear amplifier according to the present invention is described as follows.

The controlling sections 15 and 15A record appropriate transfer characteristics which are actually set for the error elimination loop 12 and the error detection loop 13 and apply them as the aforesaid appropriate transfer characteristics which are given in advance.

In other words, the transfer characteristics to be set for the error detection loop 13 and the error elimination loop 12 at the starting time or when the level of the principal signal changes abruptly are given as the actually appropriate transfer characteristics.

Therefore, flexible adaptability to fluctuation in the characteristics which may possibly occur according to conditions (power of signals and environments) under which the amplifying section 11 is in actual operation is realized and the linearity of the amplifying section 11 is highly maintained.

A principle of a seventh linear amplifier according to the present invention is described as follows.

The level monitoring section 16 monitors a level of the principal signal inputted to the error detection loop 13 and/or a level of the principal signal obtained via the error elimination loop 12. The storage section 17 stores transfer characteristics to be set for the error detection loop 13 and the error elimination loop 12 according to the level(s) of the principal signal. The controlling sections 15 and 15A apply the transfer characteristics, which are stored in the storage section 17 according to the level(s) monitored by the level monitoring section 16, as the appropriate transfer characteristic(s) for the error detection loop 13 and/or the error elimination loop 12.

In other words, even when the linearity of the amplifying section 11 varies according to the level of the principal signal, the transfer characteristics to be set for the error detection loop 13 and the error elimination loop 12 at the starting time or when the level of the principal signal changes abruptly are given as the transfer characteristics flexibly appropriate for the level.

Therefore, flexible adaptability to changes and deviations in the characteristic of the amplifying section 11 is realized and the linearity of the amplifying section 11 is highly maintained.

A principle of an eighth linear amplifier according to the present invention is described as follows.

The controlling sections 15 and 15A store in the storage section 17 the appropriate transfer characteristics which are actually set for the error detection loop 13 and the error elimination loop 12 according to the level(s) monitored by the level monitoring section 16.

In other words, even when the linearity of the amplifying section 11 changes according to the level of the principal signal, the transfer characteristics to be set for the error detection loop 13 and the error elimination loop 12 at the starting time or when the level of the principal signal changes abruptly are given as the actually appropriate transfer characteristics.

Therefore, flexible adaptability to fluctuation in the characteristic which may possibly occur according to conditions (power of signals and environments) under which the amplifying section 11 is in actual operation is realized and the linearity of the amplifying section 11 is highly maintained.

A principle of a ninth linear amplifier according to the present invention is described as follows.

The temperature monitoring section 18 monitors a temperature of the amplifying section 11 or a place thermally connected to the amplifying section 11. The storage section 17A stores transfer characteristics to be set for the error detection loop 13 and the error elimination loop 12 according to the temperature. The controlling sections 15 and 15A apply the transfer characteristics stored in the storage section 17A according to the temperature monitored by the temperature monitoring section 18 as the appropriate transfer characteristic(s) for the error detection loop 13 and/or the error elimination loop 12.

In other words, even when the linearity of the amplifying section 11 varies according to the temperature as well as the level of the principal signal, the error detection loop 13 and the error elimination loop 12 are capable of maintaining their steady states with high reliability and stability while maintaining adaptability to deviations of the linearity.

Therefore, the linearity of the amplifying section 11 is highly maintained while maintaining flexible adaptability to environmental conditions.

A principle of a tenth linear amplifier according to the present invention is described as follows.

The controlling sections 15 and 15A store in the storage section 17 the appropriate transfer characteristics, included in the updated transfer characteristics, for the error detection loop 13 and the error elimination loop 12 according to the temperature monitored by the temperature monitoring section 18.

In other words, even when the linearity of the amplifying section 11 varies according to the temperature, the transfer characteristics to be set for the error detection loop 13 and the error elimination loop 12 at the starting time or when the level of the principal signal changes abruptly are given as the actually appropriate transfer characteristics.

Therefore, flexible adaptability to fluctuation in the characteristic which may possibly occur according to conditions (power of signals and environments) under which the amplifying section 11 is in actual operation is realized and the linearity of the amplifying section 11 is highly maintained.

A principle of an eleventh linear amplifier according to the present invention is described as follows.

The controlling sections 15 and 15A apply these appropriate transfer characteristics in place of new transfer characteristics to be updated, when deviations of the new transfer characteristics relative to the appropriate transfer characteristics exceed predetermined upper limit values,.

In other words, when the error detection loop 13 and the error elimination loop 12 deviate from or may possibly deviate from their steady states due to some cause under the adaptive control by the controlling part 15, the transfer characteristics of the error detection loop 13 and the error elimination loop 12 are initialized to the appropriate transfer characteristics promptly.

Therefore, the linearity of the amplifying section 11 is stably and highly maintained.

A principle of a twelfth linear amplifier according to the present invention is described as follows.

The level adjusting section 19 sets the level of the principal signal at a low value at which the 'distortion occurring in the amplifying section 11' is reduced during a period in which each of the initial values of the plural items are obtained by the controlling sections 15 and 15A.

Therefore, decrease in accuracy of the initial values which is caused because the amplifying section 11 operates in an excessively nonlinear region is prevented and therefore, stable performance is maintained.

A principle of a thirteenth linear amplifier according to the present invention is described as follows.

During the period in which each of the initial values of the plural items are obtained by the controlling sections 15 and 15A, the level of the principal signal is set at the low value at which the distortion occurring in the amplifying section 11 is reduced.

Therefore, decrease in accuracy of the initial values which is caused because the amplifying section 11 operates in the excessively nonlinear region is prevented and therefore, stable performance is maintained.

A principle of a fourteenth linear amplifier according to the present invention is described as follows.

The correction value storage section 20 stores in advance correction values to be applied in correcting: a difference between levels of the principal signals amplified by the amplifying section 11, the difference which could occur between a level during the period in which the individual initial values of the plurality of items are obtained by the controlling sections 15 and 15A and a level after the period is over; and a margin between errors in the transfer characteristics of the error detection loop 13 and the error elimination loop 12 which occur individually according to the difference in the levels and a characteristic of the amplifying section 11. And, the controlling sections 15 and 15A correct the initial values of the plurality of items according to an actual value of the difference in the levels, by using the correction values which are stored in the correction value storage section 20.

In other words, the initial values of the transfer characteristics of the error detection loop 13 and the error elimination loop 12 are set at appropriate values with high reliability irrespective of the level of the principal signal after the period in which the individual initial values of the plural items are obtained by the controlling sections 15 and 15A.

Therefore, flexible adaptability to equipment of various level diagrams is realized.

Embodiments of the present invention are detailed below with reference to the drawings.

Figure 3:
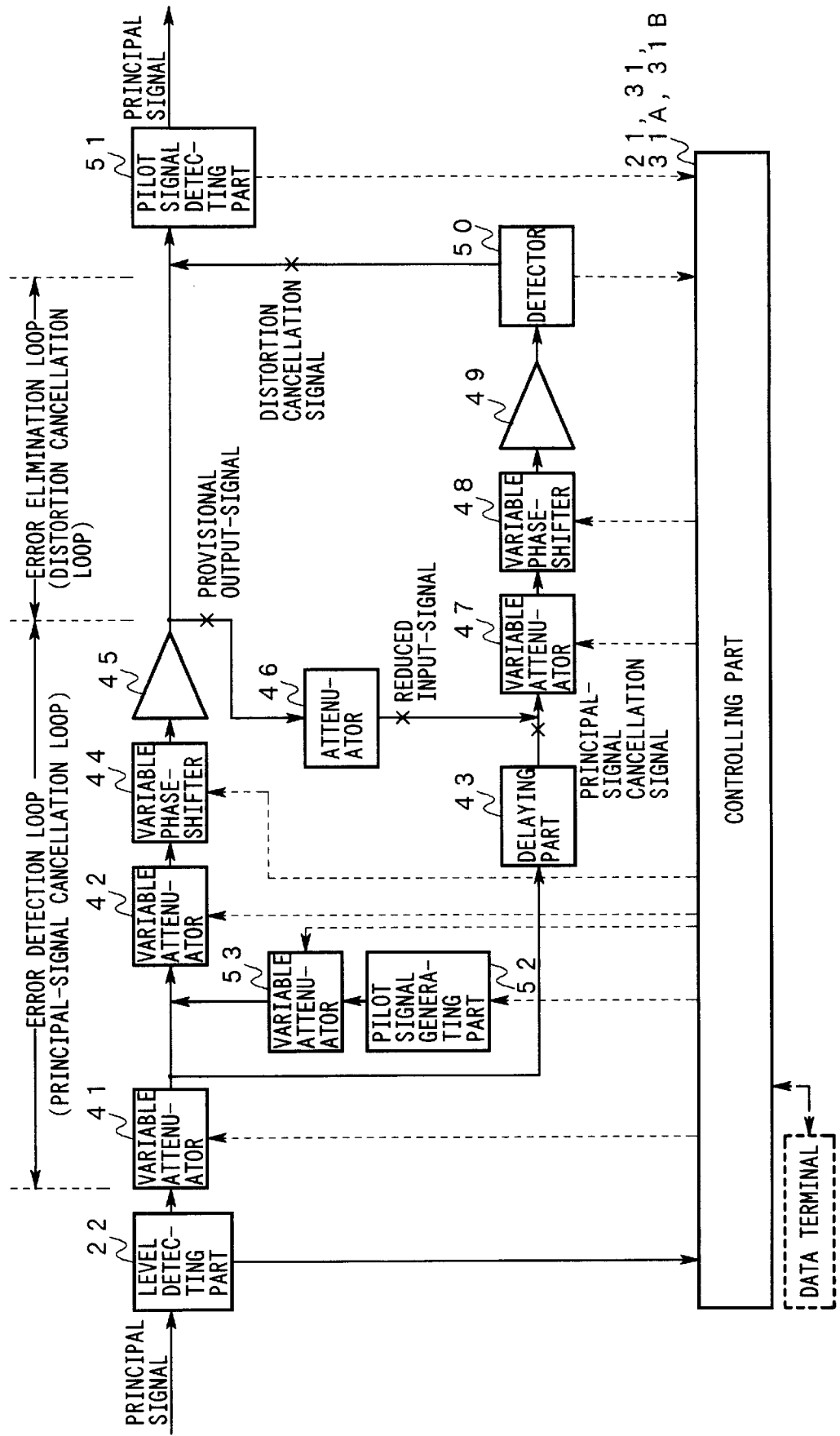
FIG. 3 is a diagram showing first to sixth embodiments of the present invention.

FIG. 3 is a diagram showing first to sixth embodiments of the present invention.

A main difference of the structure shown in the drawing from that in a conventional example shown in FIG. 16 is that a controlling part 21 is provided instead of a controlling part 54 and a level detecting part 22 whose output is connected to an input of the controlling part 21 is disposed on the preceding stage of a variable attenuator 41.

Figure 4:
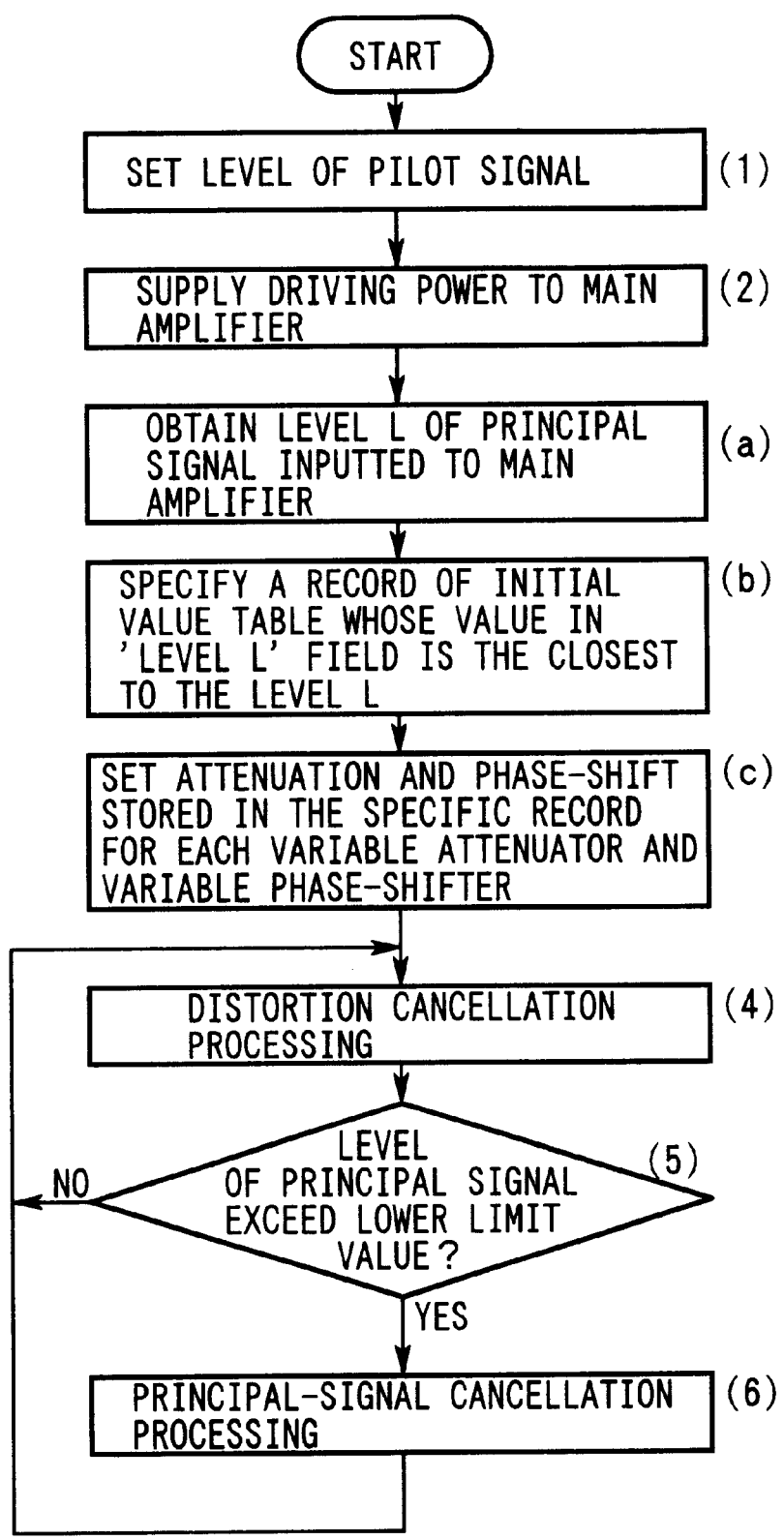
FIG. 4 is a flow chart of operations in the first embodiment of the present invention.

FIG. 4 is a flow chart of operations in the first embodiment of the present invention.

The operations in the first embodiment of the present invention are explained below with reference to FIG. 3 and FIG. 4.

The characteristics of this embodiment lie in that the controlling part 21 sets initial values of attenuation for variable attenuators 42, 47 at a starting time and in the following processing procedure of setting the initial values of the attenuation for the variable attenuators 42, 47 and initial values of phase-shift of the variable phase-shifters 44, 48.

In a specific storage area of a main memory of the controlling part 21, disposed is an initial value table 21R in which levels L (=L1, L2, . . . ) to be taken by a principal signal inputted to the variable attenuator 41, and appropriate attenuation $ATT_{ed}$, $ATT_{es}$ and appropriate phase-shift $\Phi_{ed}$, $\Phi_{es}$ which are to be set for the variable attenuators 42, 47 and the variable phase-shifters 44, 48 respectively according to the levels L1, L2, . . . are stored in advance as shown in FIG. 5.

Note that, in order to simplify the explanation, the appropriate values for the levels L, the attenuation $ATT_{ed}$, $ATT_{es}$, and the phase-shift $\Phi_{ed}$, $\Phi_{es}$ to be stored in the initial value table 21R are supposed to be expressed as pure binary numbers of an 8 bit length which are obtained in advance theoretically or by actual measurement and show any of integral numbers '0' to '255'.

The controlling part 21 also sets at the starting time a level of a pilot signal (attenuation of a variable attenuator 53) based on a similar procedure to that in the conventional example (FIG. 4(1)) and supplies driving power to the main amplifier 45 (FIG. 4(2)).

Moreover, the controlling part 21 performs initialization processing based on a different procedure, which is described below, from those in the conventional example.
- to obtain the level L of the principal signal which is measured by the level detecting part 22 and inputted to the variable attenuator 41 via the level detecting part 22 (FIG. 4(a))
- to specify a record, included in records in the initial value table 21R, whose value in a 'level L' field is the closest to the level L (hereinafter referred to as a 'specific record' (FIG. 4(b))
- to set the attenuation $ATT_{ed}$, $ATT_{es}$ and the phase-shift $\Phi_{ed}$, $\Phi_{es}$ which are stored in the specific record as the initial values for the variable attenuators 42, 47 and the variable phase-shifters 44, 48 respectively (FIG. 4(c))

Incidentally, procedures for 'distortion cancellation processing' and 'principal-signal cancellation processing' which are carried out after such initialization processing is finished are the same with those in the conventional example and therefore, the explanations thereof are omitted here.

In other words, the attenuation $ATT_{ed}$, $ATT_{es}$ and the phase-shift $\Phi_{ed}$, $\Phi_{es}$ which are consistent with the level of the actually inputted principal signal with predetermined accuracy and have appropriate values obtained in advance theoretically or by actual measurement are set as the initial values for the variable attenuators 42, 47 and the phase-shifters 44, 48.

Therefore, according to this embodiment, both of the error detection loop and the error elimination loop shift to their steady states promptly at the starting time irrespective of the level of the principal signal mentioned above.

Moreover, also when provided as a standby system of an n+1 stand-by system, the linear amplifier according to the present invention promptly starts as a substitute linear amplifier for a linear amplifier in which some failure occurs and thereby continuation of service for an existing completed call is realized with high reliability.

Note that in this embodiment, the initial value table 21R is constituted as a combination of a plurality of records which correspond to the values of the levels L to be taken by the principal signal and each of the records includes fields in which the initial values of the attenuation $ATT_{ed}$, $ATT_{es}$ and the phase-shift $\Phi_{ed}$, $\Phi_{es}$ are included respectively.

However, the initial value table 21R may be constituted, for example, as follows.
- It is constituted as a single record which does not include the 'level L' field (consistent with a case where time required for both of the error detection loop and the error elimination loop to shift to their steady states is at or less than predetermined upper limit values irrespective of the level of the principal signal).
- It does not include the 'level L' field (consistent with a case where a range, among ranges of the levels L to be taken by the principal signal, to which each of the combinations of the initial values of the attenuation $ATT_{ed}$, $ATT_{es}$ and the phase-shift $\Phi_{ed}$, $\Phi_{es}$ is to be applied is known)
- Only the initial values of a part of the attenuation $ATT_{ed}$, $ATT_{es}$ and the phase-shift $\Phi_{ed}$, $\Phi_{es}$ are registered in advance.

In this embodiment the level detecting part 22 is disposed on a preceding stage of the variable attenuator 41.

Figure 6:
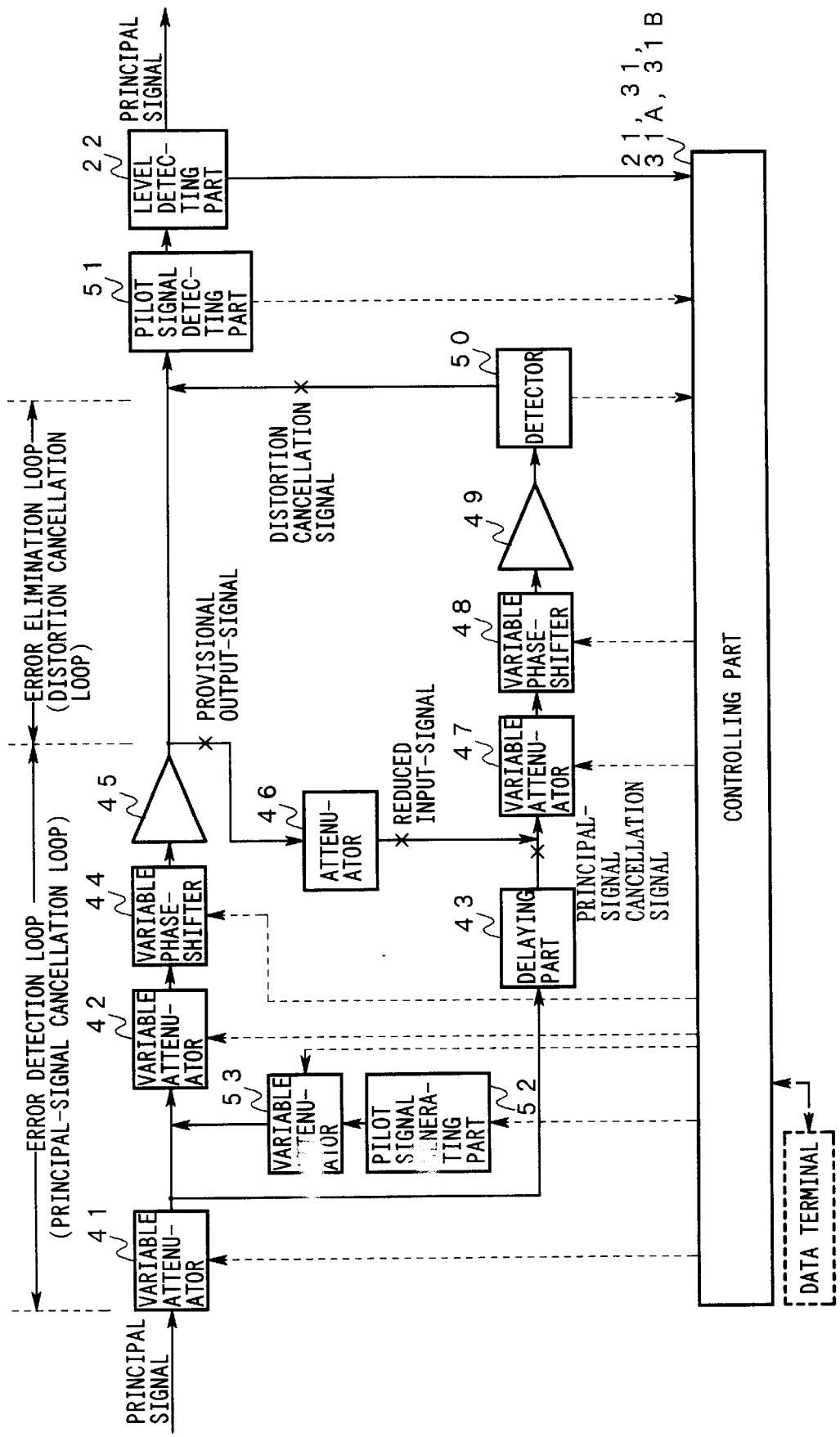
FIG. 6 is a diagram showing another structure of the first to sixth embodiments of the present invention.

However, the present invention is not limited to this structure and, for example, either one of the following structures may be applied thereto.
- The level detecting part 22 is disposed on a subsequent stage of a pilot signal detecting part 51 as shown in FIG. 6 and values in the 'level L' field of the initial value table 21R are registered as the levels to be taken by the principal signal which are obtained in an output of the pilot signal detecting part 51.
- A level detecting part is disposed on the subsequent stage of the pilot signal detecting part 51 and the values in the 'level L' field of the initial value table 21R are registered as a pair of levels of the principal signal which are detected separately by both of the level detecting parts so that flexible adaptability to fluctuation in the characteristics according to changes in environmental conditions and aging is realized.

The second embodiment of the present invention is explained below with reference to FIG. 3.

A main difference of the structure of this embodiment from that of the first embodiment as described above is that a controlling part 31 is provided instead of the controlling part 21 and a storage area where the initial value table 21R is disposed, included in storage areas of a main memory of the controlling part 31, is formed as a nonvolatile storage area.

Figure 7:
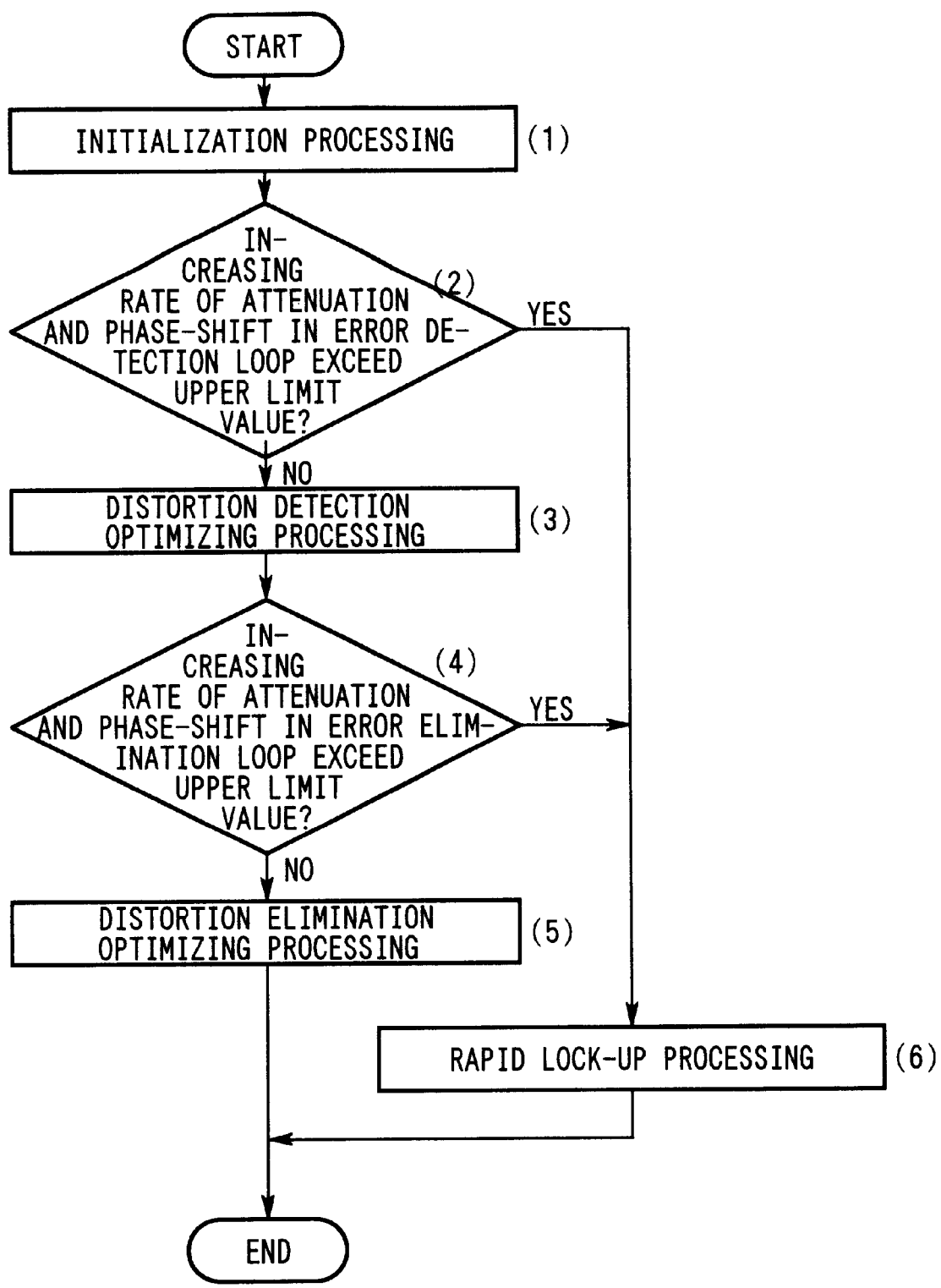
FIG. 7 is a flow chart of operations in the second embodiment of the present invention.

FIG. 7 is a flow chart of operations in the second embodiment of the present invention.

The operations in the second embodiment of the present invention are explained below with reference to FIG. 3 and FIG. 7.

The characteristic of this embodiment lies in the following processing procedure which is performed after the controlling part 31 finishes the aforesaid initialization processing at the starting time.

Incidentally, the processing performed by the controlling part 31 is the same with the processing performed by the controlling part 21 in the first embodiment as described above except that the following processing is additionally performed.

After finishing the initialization processing (FIG. 7(1)), the controlling part 31 discriminates whether or not a rate of change in a value of the attenuation $ATT_{ed}$ of the variable attenuator 42 and/or a rate of change in a value of the phase-shift $\Phi_{ed}$ of the phase-shifter 44 exceed(s) a predetermined upper limit value (FIG. 7(2)). When the result of the discrimination (hereinafter referred to as a 'first discrimination') is false, the controlling part 31 specifies a specific record, included in the records in the initial value table 21R, whose value in the 'level L' field is the closest to a level detected by the level detecting part 22 at that time and stores a newest value of the attenuation $ATT_{ed}$ and/or a newest value of the phase-shifted $\Phi_{ed}$ in corresponding field(s) of the specific record. Note that this processing is hereinafter referred to simply as 'distortion detection optimizing processing' (FIG. 7(3)).

Furthermore, the controlling part 31 discriminates whether or not a rate of change in a value of the attenuation $ATT_{es}$ of the variable attenuator 47 and/or a rate of change in a value of the phase-shift $\Phi_{es}$ of the phase-shifter 48 exceed(s) a predetermined upper limit value (FIG. 7(4)). When the result of the discrimination (hereinafter referred to as a 'second discrimination') is false, the controlling part 31 specifies a specific record, included in the records in the initial value table 21R, whose value in the 'level L' field is the closest to the level detected by the level detecting part 22 at that time and stores a newest value of the attenuation $ATT_{es}$ and/or a newest value of the phase-shift $\Phi_{es}$ in corresponding field(s) of the specific record. Note that this processing is hereinafter referred to simply as 'distortion elimination optimizing processing' (FIG. 7(5)).

Furthermore, when either one of the results of the first discrimination and the second discrimination is true, the controlling part 31 performs neither the 'distortion detection optimizing processing' nor the 'distortion elimination optimizing processing' and performs the following processing (hereinafter referred to as 'rapid lock processing') (FIG. 7(6)).

- to specify the specific record, included in the records in the initial value table 21R, whose value in the 'level L' field is the closest to the level detected by the level detecting part 22 at that time
- to set the attenuation $ATT_{ed}$, $ATT_{es}$ and the phase-shift $\Phi_{ed}$, $\Phi_{es}$ which are stored in the corresponding fields of the specific record for the variable attenuators 42, 47 and the variable phase-shifters 44, 48 respectively In other words, the values in each of the fields of the initial value table 21R are updated when necessary to appropriate values at which the states of the error detection loop and the error elimination loop are actually maintained in their steady states and the attenuation and the phase-shift which are set at the appropriate values are promptly applied when an abrupt change of the states occurs in their steady operational processes as well as at the starting time.

Therefore, according to this embodiment, flexible adaptability to fluctuation in the characteristics according to environmental conditions such as temperatures, power supply voltage, and others and aging is realized and performance is stabilized.

Incidentally, the level detecting part is provided on the preceding stage of the variable attenuator 41 and/or the subsequent stage of the pilot signal detecting part 51 in this embodiment.

However, the present invention is not limited to this structure and, for example, the following structure may be applied thereto to detect and eliminate distortion generated in the main amplifier 45 with high accuracy.

Figure 8:
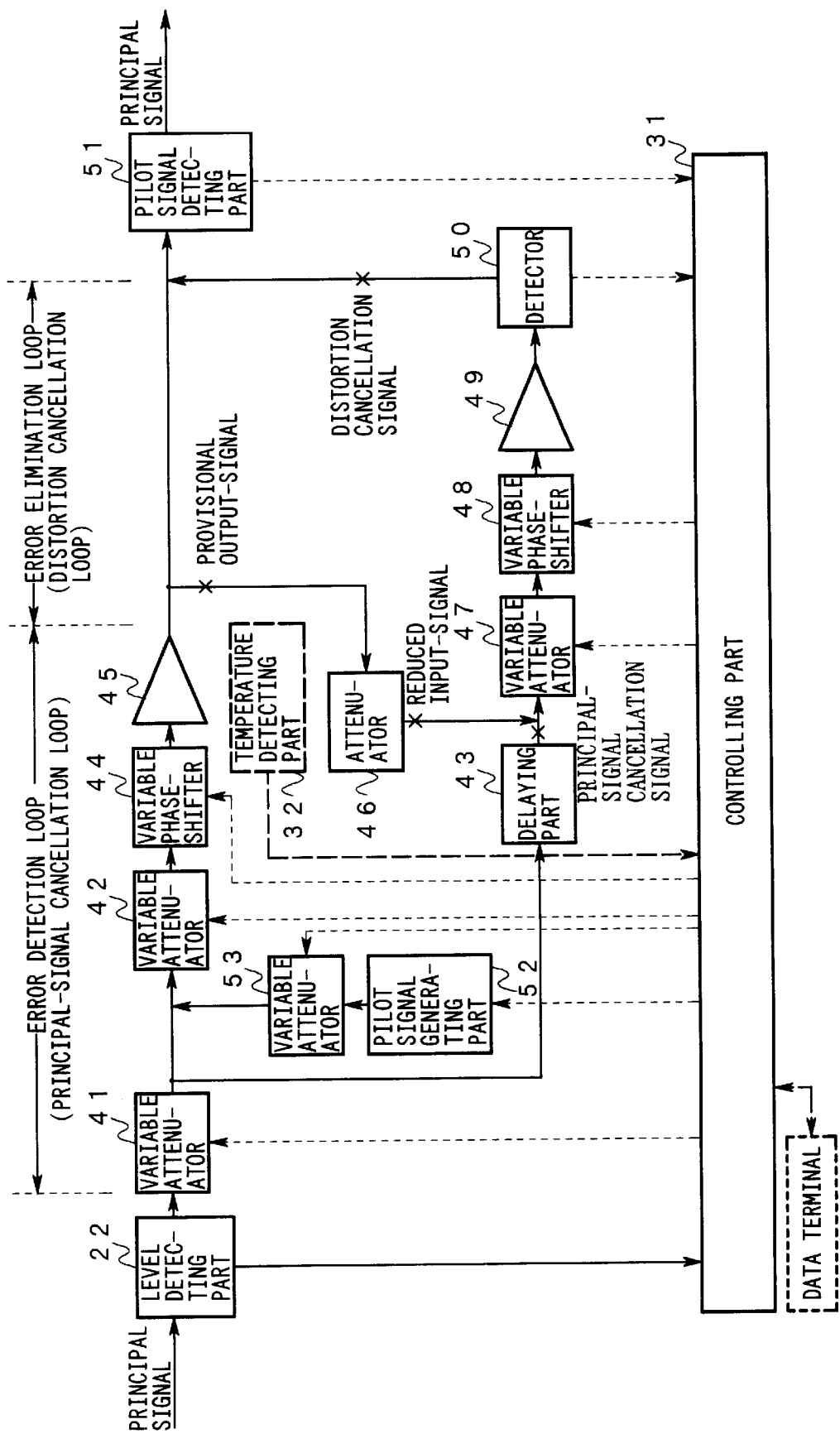
FIG. 8 is a diagram showing another structure of the second embodiment of the present invention.

- A temperature detecting part 32 whose output is connected to a corresponding input port of the controlling part 31 is provided in a predetermined region which is thermally coupled to the main amplifier 45 as shown in FIG. 8.
- As the basis for selecting the aforesaid specific record, the controlling part 31 refers to values in a 'temperature T' field which is added to each record in an initial value table 31R substituting for the initial value table 21R and in which temperatures to be detected by the temperature detecting part 32 are stored as shown in FIG. 9.

The third embodiment of the present invention is explained below.

A main difference of the structure of this embodiment from that of the second embodiment as described above is that a controlling part 31A is provided instead of the controlling part 31.

Figure 10:
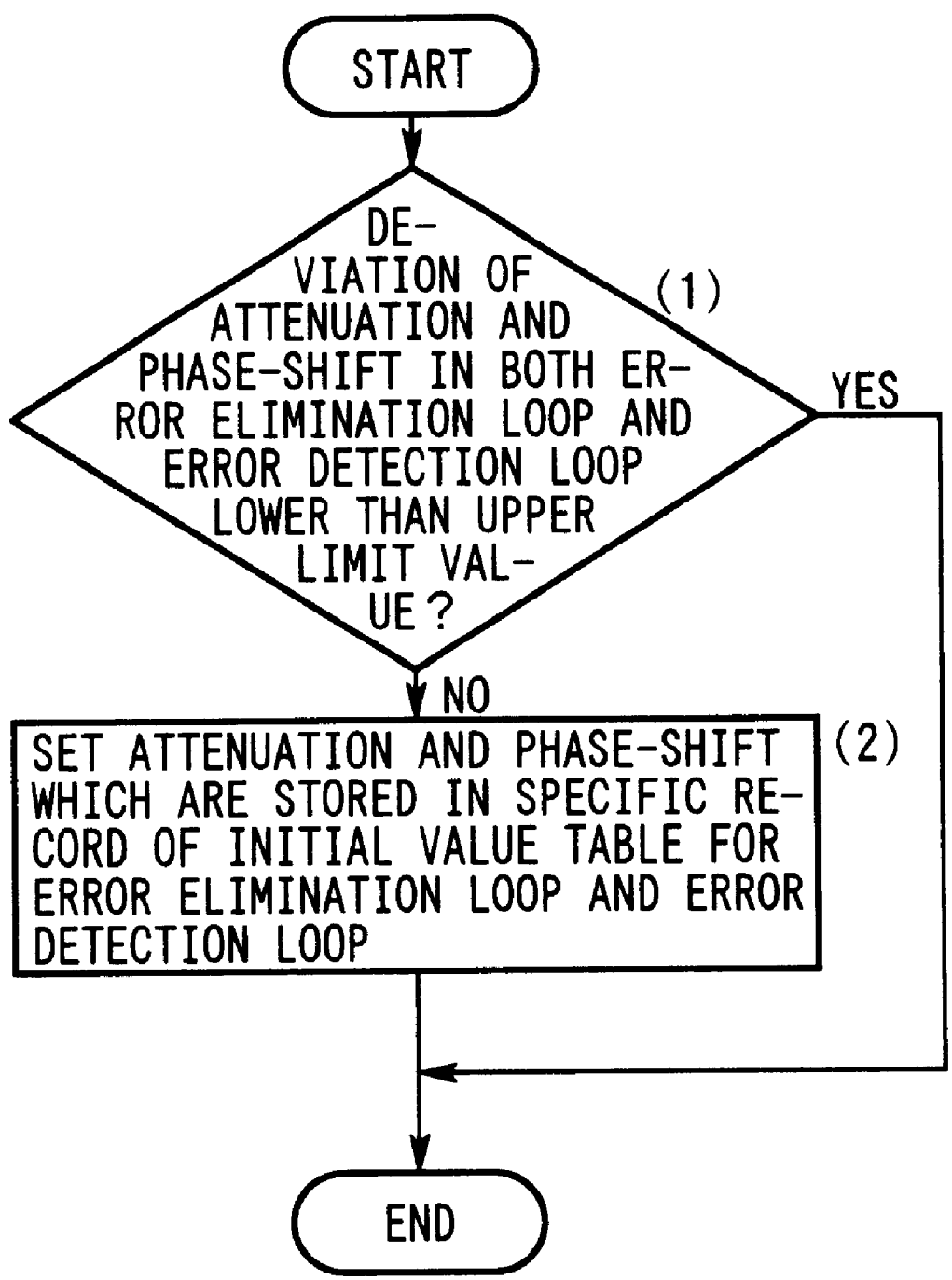
FIG. 10 is a flow chart of operations in the third embodiment of the present invention.

FIG. 10 is a flow chart of operations in the third embodiment of the present invention.

Figure 11:
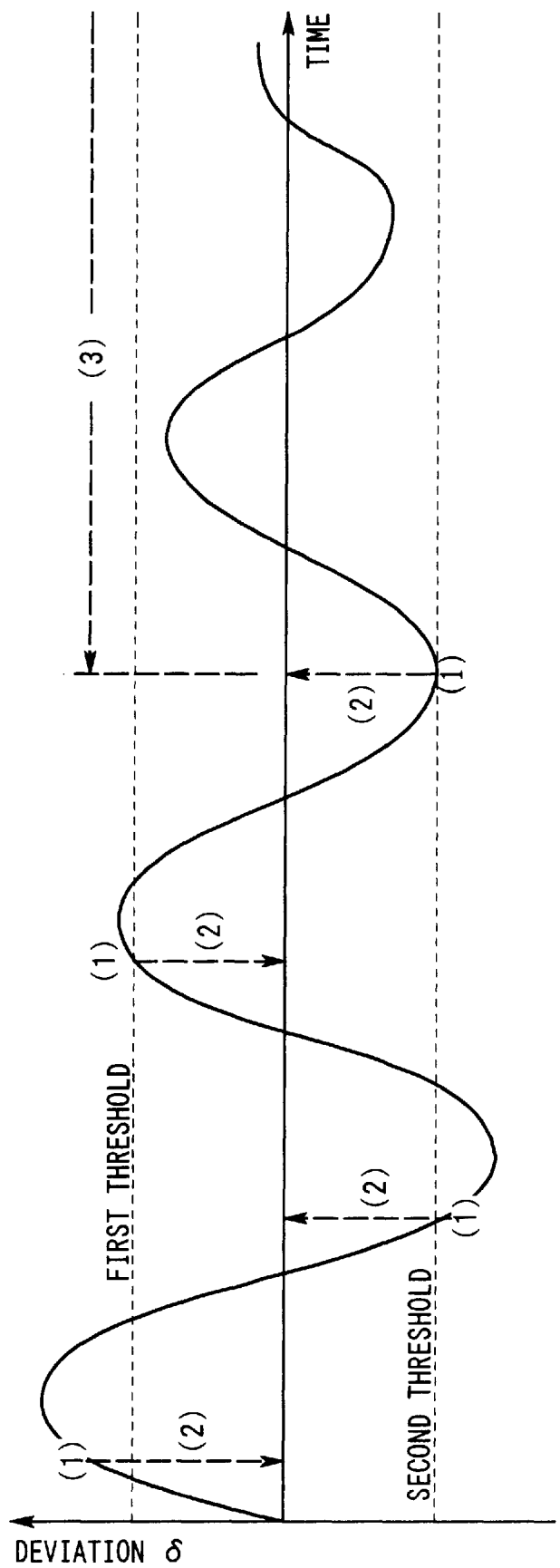
FIG. 11 is a chart (1) explaining the operations in the third embodiment of the present invention.

FIG. 11 is a chart (1) explaining the operations in the third embodiment of the present invention.

Figure 12:
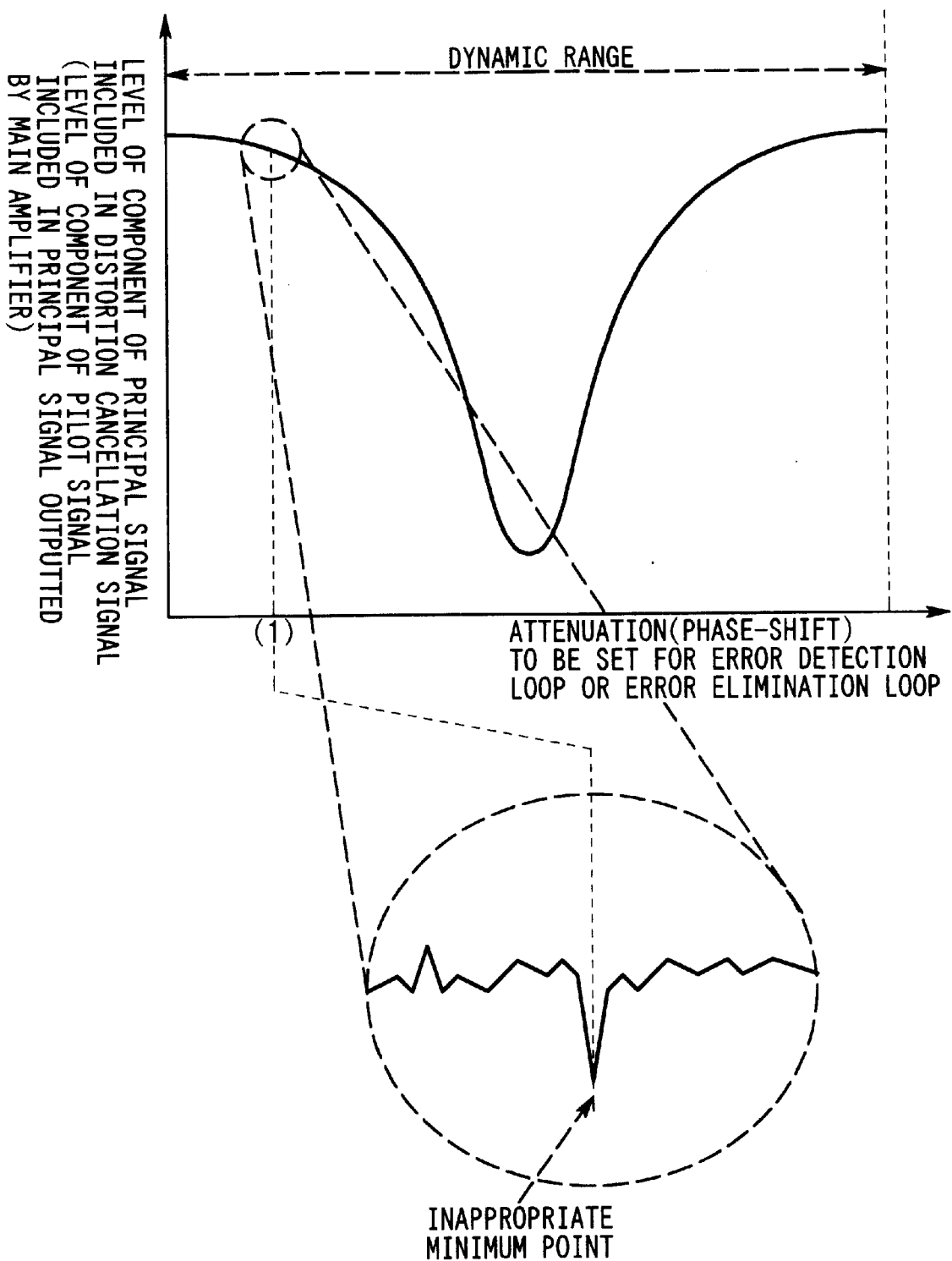
FIG. 12 is a chart (2) explaining the operations in the third embodiment of the present invention.

FIG. 12 is a chart (2) explaining the operations in the third embodiment of the present invention.

The operations in this embodiment are explained below with reference to FIG. 3 and FIG. 10 to FIG. 12.

The characteristic of this embodiment lies in the following processing procedure which is carried out constantly by the controlling part 31A after the aforesaid initialization is finished.

The controlling part 31A appropriately discriminates the specific record included in the records in the initial value table 21R (31R) and performs the following processing every time it obtains, based on predetermined adaptive control, new attenuation $ATT_{ed}$, $ATT_{es}$ and phase-shift $\phi_{ed}$, $\phi_{es}$ to be set for the variable attenuators 42, 47 and the phase-shifters 44, 48 respectively.

to discriminate whether or not deviations $\delta a_{ed}$, $\delta\phi_{ed}$, $\delta a_{es}$, and $\delta\phi_{es}$ which are expressed by the following formulas for the attenuation $att_{ed}$, $att_{es}$ and the phase-shift $\phi_{ed}$, $\phi_{es}$, and the attenuation $ATT_{ed}$, $ATT_{es}$ and the phase-shift $\Phi_{ed}$, $\Phi_{es}$ which are stored in the corresponding fields of the specific record are at or lower than predetermined upper limit values th1, th2, th3, and th4 (all of them are supposed to be positive numbers to simplify the explanation here) respectively (FIG. 10(1)).

$$\delta a_{ed} = |att_{ed} - ATT_{ed}|$$

$$\delta\phi_{ed} = |att_{ed} - ATT_{ed}|$$

$$\delta a_{es} = |\phi_{es} - \Phi_{es}|$$

$$\delta\phi_{es} = |\phi_{es} - \Phi_{es}|$$

Only when the result of this discrimination is false, the attenuation $\text{Att}_{ed}$, $\text{Att}_{es}$ and the phase-shift $\Phi_{ed}$, $\Phi_{es}$ which are stored in the corresponding fields of the specific record are set for the variable attenuators 42, 47 and the phase-shifters 44, 48 respectively in place of the new attenuation $\text{att}_{ed}$, $\text{att}_{es}$ and the phase-shift $\phi_{ed}$, $\phi_{es}$ (FIG. 10(2)).

Therefore, a combination of the attenuation $\text{att}_{ed}$, $\text{att}_{es}$ and the phase-shift $\phi_{ed}$, $\phi_{es}$ to be set for the variable attenuators 42, 47 and the variable phase-shifters 44, 48 respectively under the adaptive control is replaced by the combination of the appropriate values promptly (FIG. 11(2)) when their deviations $\delta a_{ed}$, $\delta \phi_{ed}$, $\delta a_{es}$, and $\delta \phi_{es}$ relative to a combination of the appropriate values which are stored in the initial value table 21R (31R) in advance are too large to be permitted (FIG. 11(1)).

In this way, according to this embodiment, the error detection loop and the error elimination loop can shift to their steady states promptly with high reliability in any of the following cases (FIG. 11(3)).

when the steady states are not able to be maintained due to an abrupt change in the level of the inputted principal signal, a change in environmental conditions, aging, and others when the attenuation of the variable attenuator 42 and the phase-shift of the phase-shifter 44 (the transfer characteristic of the error detection loop) converges on an inappropriate minimal value (FIG. 12(1)), included in minimal values of a 'level of a component of the principal signal included in a distortion cancellation signal (detected by a detector 50)', for the attenuation of the variable attenuator 42 and the phase-shift of the variable phase-shifter 44 when the attenuation of the variable attenuator 47 and the phase-shift of the phase-shifter 48 (the transfer characteristic of the error elimination loop) converges on an inappropriate minimal value (FIG. 12(1)), included in minimal values of a 'level of a component of the pilot signal included in a signal obtained via the 'error elimination loop' (detected by the pilot signal detecting part 51)', for the attenuation of the variable attenuator 47 and the phase-shift of the variable phase-shifter 48.

Therefore, total linearity is stably maintained with high reliability.

Incidentally, in this embodiment, the discrimination described above is carried out collectively for both of the error detection loop and the error elimination loop.

However, the present invention is not limited to this structure and the discrimination and the processing to be performed when the discrimination result is false may be carried out separately for each of the error detection loop (a pair of the variable attenuator 42 and the variable phase-shifter 44) and the error elimination loop (a pair of the variable attenuator 47 and the variable phase-shifter 48).

The fourth embodiment of the present invention is explained below.

A main difference of the structure of this embodiment from that of the first embodiment as described before is that a controlling part 31B is provided instead of the controlling part 21.

Figure 13:
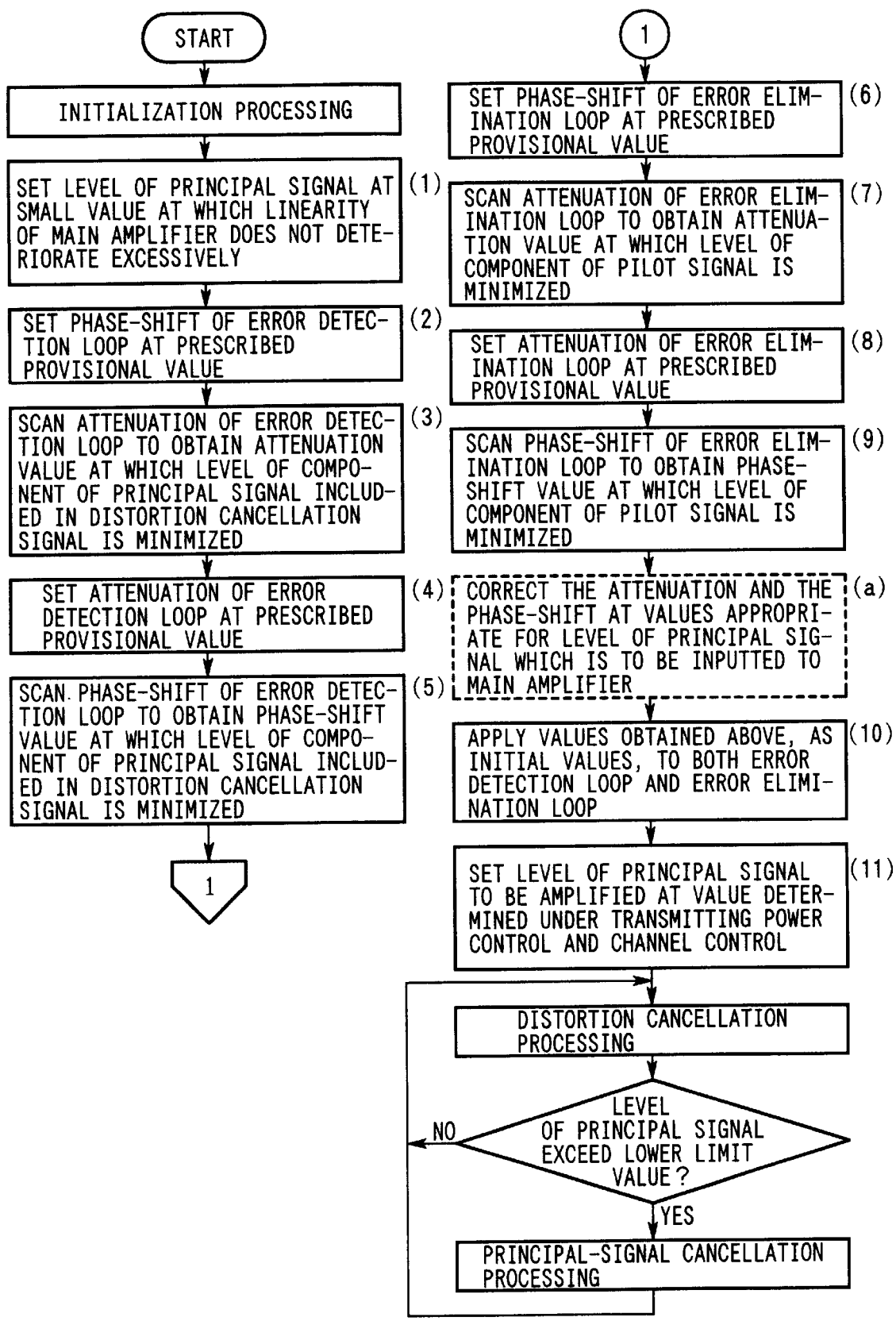
FIG. 13 is a flow chart of operations in the fourth and fifth embodiments of the present invention.

FIG. 13 is a flow chart of operations in the fourth and fifth embodiments of the present invention.

The operations in this embodiment are explained below with reference to FIG. 3 and FIG. 13.

The characteristic of this embodiment lies in the following processing procedure which is performed by the controlling part 31B.

The controlling part 31B performs the following processing (1) to (7) after finishing the aforesaid initialization processing.

(1) to set attenuation of the variable attenuator 41 according to the level of the principal signal detected by the level detecting part 22 at a value small enough for a level of the distortion generated in the amplifier 45 to become lower than a predetermined threshold (FIG. 13(1))

(2) to set the phase-shift of the variable phase-shifter 44 at a predetermined provisional value (supposed to be '80H' here to simplify the explanation) (FIG. 13(2)) and scan the attenuation of the variable attenuator 42 (subsequently variable, for example, from '00H' to 'FFH') to obtain the attenuation value $\text{ATT}_{ed}$ at which the level of the component of the principal signal included in the distortion cancellation signal (detected by the detector 50) is minimized (FIG. 13(3))

(3) to set the attenuation of the variable attenuator 42 at a predetermined provisional value (supposed to be '80H' here to simplify the explanation) (FIG. 13(4)) and scan the phase-shift of the variable phase-shifter 44 (subsequently variable, for example, from '00H' to 'FFH') to obtain the phase-shift value $\Phi_{ed}$ at which the level of the component of the principal signal included in the distortion cancellation signal (detected by the detector 50) is minimized (FIG. 13(5))

(4) to set the phase-shift of the variable phase-shifter 48 at a predetermined provisional value (supposed to be '80H' here to simplify the explanation) (FIG. 13(6)) and scan the attenuation of the variable attenuator 47 (subsequently variable, for example, from '00H' to 'FFH') to obtain the attenuation value $\text{ATT}_{es}$ at which the level of the component of the pilot signal detected by the pilot signal detecting part 51 is minimized (FIG. 13(7))

(5) to set the attenuation of the variable attenuator 47 at a predetermined provisional value (supposed to be '80H' here to simplify the explanation) (FIG. 13(8)) and scan the phase-shift of the variable phase-shifter 48 (subsequently variable, for example, from '00H' to 'FFH') to obtain the phase-shift value $\Phi_{es}$ at which the level of the component of the pilot signal detected by the pilot signal detecting part 51 is minimized (FIG. 13(9))

(6) to apply the values $\text{ATT}_{ed}$, $\text{ATT}_{es}$, $\Phi_{ed}$, and $\Phi_{es}$ as the initial values of the attenuation for the variable attenuators 42, 47 and the initial values of the phase-shift for the variable phase-shifters 44, 48 (FIG. 13(10))

(7) to set the attenuation of the variable attenuator 41 at a value determined under transmitting power control and channel control (FIG. 13(11))

That is, the initial values of the attenuation for the variable attenuators 42, 47 and the initial values of the phase-shift for the variable phase-shifters 44, 48 are both obtained and set when necessary in the processing processes which are carried out under the control of the controlling part 31B at the starting time.

Consequently, both of the error detection loop and the error elimination loop shift to their steady states promptly without the initial value tables 21R, 31R being provided even when the characteristics change according to fluctuation in environmental conditions and aging.

The fifth embodiment of the present invention is explained below.

A main difference of this embodiment from the fourth embodiment as described above is that the values $\text{ATT}_{ed}$, $\text{ATT}_{es}$, $\Phi_{ed}$ and $\Phi_{es}$ which are obtained similarly to the fourth embodiment are applied as the initial values after they are corrected by the controlling part 31B as follows.

In a storage area of a main memory of the controlling part 31B, a first correction value table 33 which is constituted as a combination of records including fields in which respective values described below are stored is disposed as shown in FIG. 14.

- a difference between the attenuation set in advance for the variable attenuator 41 and the attenuation to be set for the variable attenuator 41 under the transmitting power control and the channel control (hereinafter referred to as 'difference attenuation') as described later
- correction values $\Delta a_{ed}$, $\Delta a_{es}$, $\Delta \phi_{ed}$, and $\Delta \phi_{es}$ to be applied in correcting the values $ATT_{ed}$, $ATT_{es}$, $\Phi_{ed}$, and $\Phi_{es}$ respectively according to the difference attenuation In the storage area of the main memory of the controlling part 31B, a second correction value table 34 which is constituted as a combination of records including fields in which the following values are stored in advance respective is disposed as shown in FIG. 15.

- a difference (hereinafter referred to as a 'difference level') between a level of the principal signal which is given to the variable attenuator 41 in a normal state (hereinafter referred to as a 'rated value') and a level of the principal signal which is given to the variable attenuator 41 from the preceding stage of the variable attenuator 41 at the starting time
- correction values $\Delta a\hat{}_{ed}$, $\Delta\hat{}a_{es}$, $\Delta\phi\hat{}_{ed}$, and $\Delta\phi\hat{}_{es}$ to be applied in correcting the values $ATT_{ed}$, $ATT_{es}$, $\Phi_{ed}$ and $\Phi_{es}$ respectively according to the difference level Note that all of the correction values $\Delta a_{ed}$, $\Delta a_{es}$, $\Delta\phi_{ed}$, $\Delta\phi_{es}$, $\Delta a\hat{}_{ed}$, $\Delta\hat{}a_{es}$, $\Delta\phi\hat{}_{ed}$, and $\Delta\phi\hat{}_{es}$ are supposed to be obtained by actual measurement or theoretically in advance and given as binary numbers of an 8 bit length (shown as 2's complement when negative).

After obtaining the values $ATT_{ed}$, $ATT_{es}$, $\Phi_{ed}$, and $\Phi_{es}$ similarly to the fourth embodiment as described above (FIG. 13(1) to (9)), the controlling part 31B computes the initial values of the attenuation to be set for the variable attenuators 42, 47 and the initial values of the phase-shift to be set for the variable phase-shifters 44, 48 based on the following procedure.

(1) to specify the attenuation to be given to the variable attenuator 41 under the channel control and the transmitting power control and compute the difference between this attenuation and the attenuation which is set in advance for the variable attenuator 41 to obtain the difference attenuation
(2) to specify the level of the principal signal to be given to the variable attenuator 41 from the preceding stage of the variable attenuator 41 under the channel control and the transmitting power control and compute the difference between this level and the level of the principal signal which is given in advance to the variable attenuator 41 to obtain the difference level
(3) to specify a record, included in the records in the first correction value table 33, whose value in a 'difference attenuation' field is equal to the difference attenuation with predetermined accuracy, and obtain the correction values $\Delta a_{ed}$, $\Delta a_{es}$, $\Delta\phi_{ed}$, and $\Delta\phi_{es}$, which are stored in the respective fields of the record
(4) to specify a record, included in the records in the second correction value table 34, whose value in a 'difference level' field is equal to the difference level with predetermined accuracy, and obtain the correction values $\Delta a\hat{}_{ed}$, $\Delta\hat{}a_{es}$, $\Delta\phi\hat{}_{ed}$, and $\Delta\phi\hat{}_{es}$, which are stored in the respective fields of the record
(5) to perform arithmetic operations as expressed by the following formulas to compute the initial values $ATTi_{ed}$, $ATTi_{es}$, $\Phi i_{ed}$, and $\Phi i_{es}$ $$ATTi_{ed}=ATT_{ed}+\Delta a_{ed}+\Delta a\hat{}_{ed}$$

$$ATTi_{es}=ATT_{es}+\Delta\phi_{es}+\Delta\phi\hat{}_{es}$$

$$\Phi i_{ed}=\Phi_{ed}+\Delta a_{ed}+\Delta a\hat{}_{ed}$$

$$\Phi i_{es}=\Phi_{es}+\Delta\phi_{es}+\Delta\phi\hat{}_{es}$$

(6) to apply the initial values $ATTi_{ed}$, $ATTi_{es}$, $\Phi i_{ed}$, and $\Phi i_{es}$ as the initial values of the attenuation for the variable attenuators 42, 47 and the initial values of the phase-shift for the variable phase-shifters 44, 48 respectively In other words, the initial values of the attenuation of the variable attenuators 42, 47 and the phase-shift of the variable phase-shifters 44, 48 are corrected automatically at values appropriate for the level of the principal signal which is actually inputted to the main amplifier 45 after the starting time (FIG. 13(a)).

Therefore, according to this embodiment, both of the error detection loop and the error elimination loop are able to shift to their steady states promptly and precisely at the starting time compared to the fourth embodiment as described above.

Incidentally, the second correction value table 34 is provided in this embodiment.

However, the present invention is not limited to this structure and, for example, when the level of the principal signal which is given to the variable attenuator 41 from the preceding stage of the variable attenuator 41 is maintained at a fixed value from the starting time, only the correction values which are obtained by referring to the first correction value table 33 may be applied.

Operations in the sixth embodiment of the present invention are explained below with reference to FIG. 3.

A main difference of this embodiment from the first to fifth embodiments described above is that the controlling parts 21, 31, 31A, and 31B performs the following processing.

As a known threshold, a maximum level of the principal signal at which the value of a component of the distortion generated by the main amplifier 45 is small enough to be neglected is given to the controlling parts 21, 31, 31A, and 31B in advance After finishing the initialization processing, the controlling parts 21, 31, 31A, and 31B compare the level of the principal signal detected by the level detecting part 22 and the maximum level, and during a period in which the former is lower than the latter, set maximum attenuation for the variable attenuator 53 or stop the operation of a pilot signal generating part 52 to restrict the injection of the pilot signal to an error detection loop.

Meanwhile, during a period in which the level of the principal signal detected by the level detecting part 22 is higher than the maximum level, the controlling parts 21, 31, 31A, 31B allow the injection of the pilot signal to the error detection loop.

In other words, when the level of the principal signal inputted to the main amplifier 45 is low enough for input output characteristics of the main amplifier 45 to be considered to be linear, power consumed in the pilot signal generating part 52 and power consumed uselessly in the main amplifier 45 because the pilot signal is superimposed on the inputted principal signal are saved and increase in the spurious due to leakage of the pilot signal to an output end of the pilot signal detecting part 51 is prevented.

Therefore, according to this embodiment, running cost is reduced and also transmission quality is enhanced.

Incidentally, in this embodiment, the controlling parts 21, 31, 31A, and 31B discriminates whether or not the level of the principal signal inputted to the main amplifier 45 is lower than the threshold.

However, the present invention is not limited to this structure and, for example, when binary information equivalent to the result of this discrimination is given from outside based on a procedure of the channel control and the result of the transmitting power control, it may be discriminated directly or via the controlling parts 21, 31, 31A, and 31B based on logical values of the binary information whether or not the pilot signal should be injected to the error detection loop.

Moreover, the injection of the pilot signal to the error detection loop may be restricted or started when necessary, for example, according to a demand given by an operator via a data terminal and so on which are connected to the controlling parts 21, 31, 31A, and 31B as shown by dotted lines in FIG. 3, FIG. 6, and FIG. 8 to enhance efficiency of measuring and confirming of the spurious which should be performed with high accuracy in maintenance and operation processes.

In the above-described embodiments, the present invention is applied to a power amplifier which is mounted in a radio base station forming sector cells in a mobile communication system of a CDMA and structured redundantly based on the n+1 stand-by system.

However, the present invention is not limited to be applied to such a radio base station and it may be applied to any equipment and system regardless of a frequency band, an occupied bandwidth of a signal to be amplified, and a modulation/demodulation system which is applied in transmitting/receiving the signal as long as it can be expected that the equipment responds to its start and abrupt changes in operational conditions flexibly and at a high speed and stably maintains high linearity.

Moreover, the present invention is not limited to the above embodiments and various modifications may be made without departing from the spirit and scope of the invention and any improvement may be made in part or all of the components.

What is claimed is:

1. A linear amplifier comprising:
   an amplifying section for amplifying a principal signal on which a pilot signal with a known frequency is superimposed, whose linearity is maintained based on feed-forward technique;
   a monitoring section for extracting a component of said pilot signal included as a distortion component at an output end of an error elimination loop which is included in said amplifying section; and
   a controlling section to which appropriate transfer characteristics for said error elimination loop and an error detection loop included in said amplifying section are given in advance and which applies the appropriate transfer characteristics at a starting time and updates the transfer characteristics under adaptive control which minimizes a level of the pilot signal extracted by said monitoring section.

2. The linear amplifier according to claim 1,
   wherein said controlling section records appropriate transfer characteristics, included in said updated transfer characteristics, of said error elimination loop and said error detection loop and applies them as said appropriate transfer characteristics which are given in advance.

3. The linear amplifier according to claim 1, further comprising:
   a level monitoring section for monitoring a level of the principal signal inputted to said error detection loop and/or a level of the principal signal obtained via said error elimination loop; and
   a storage section for storing transfer characteristics to be set for said error detection loop and said error elimination loop according to the level(s) of said principal signal, and wherein
   said controlling section applies the transfer characteristics, which are stored in said storage section according to the level(s) monitored by said level monitoring section, as the appropriate transfer characteristic(s) for said error detection loop and/or said error elimination loop.

4. The linear amplifier according to claim 3,
   wherein said controlling section stores in said storage section the appropriate transfer characteristics, included in said updated transfer characteristics, for said error detection loop and said error elimination loop according to the level(s) monitored by said level monitoring section.

5. The linear amplifier according to claim 1, further comprising:
   a temperature monitoring section for monitoring a temperature of said amplifying section or a place thermally connected to said amplifying section; and
   a storage section for storing transfer characteristics to be set for said error detection loop and said error elimination loop according to said temperature(s), and wherein
   said controlling section applies the transfer characteristics which are stored in said storage section according to the temperature(s) monitored by said temperature monitoring section as the appropriate transfer characteristic(s) for said error detection loop and/or said error elimination loop.

6. The linear amplifier according to claim 5,
   wherein said controlling section stores in said storage section the appropriate transfer characteristics, included in said updated transfer characteristics, for said error detection loop and said error elimination loop according to the temperature(s) monitored by said temperature monitoring section.

7. The linear amplifier according to claim 1,
   wherein said controlling section applies said appropriate transfer characteristics in place of new transfer characteristics to be updated, when a deviation of the new transfer characteristic relative to said appropriate transfer characteristic exceed predetermined upper limit values.

8. The linear amplifier according to claim 1, wherein said controlling section
   determines initial values as values at which the level of the pilot signal extracted by said monitoring section becomes minimum, said initial values being for each of a plurality of items whose cross-correlation is low and which gives the transfer characteristics of said error detection loop and said error elimination loop, said determining done by scanning each of said initial values while fixing values of other items at predetermined values, and
   applies a combination of the initial values as the appropriate transfer characteristics.

9. The linear amplifier according to claim 8, further comprising
   a level adjusting section for setting a level of said principal signal at a low value at which the distortion occurring in said amplifying section is reduced, during a period in which each of said initial values of said plurality of items are obtained by said controlling section.

10. The linear amplifier according to claim 9, further comprising
a correction value storage section for storing in advance correction values to be applied in correcting
a difference between levels of the principal signals amplified by said amplifying section, said difference which could occur between a level during the period in which the individual initial values of said plurality of items are obtained by said controlling section and a level after said period is over, and
a margin between errors in the transfer characteristics of said error detection loop and said error elimination loop which occur individually according to the difference in said levels and a characteristic of said amplifying section, and wherein
said controlling section corrects the initial values of said plurality of items according to an actual value of said difference in the levels, by using the correction values which are stored in said correction value storage section.

11. A linear amplifier comprising:
an amplifying section for amplifying a principal signal on which a pilot signal with a known frequency is superimposed, whose linearity is maintained based on feed-forward technique;
a monitoring section for extracting a component of said pilot signal included as a distortion component at an output end of an error elimination loop which is included in said amplifying section; and
a controlling section to which appropriate transfer characteristics for said error elimination loop and an error detection loop included in said amplifying section are given in advance and which applies the appropriate transfer characteristics when a rate of change in a level of the principal signal inputted to said amplifying section or outputted by said amplifying section exceeds a predetermined threshold and updates the transfer characteristics under adaptive control which minimizes a level of the pilot signal which is extracted by said monitoring section.

12. The linear amplifier according to claim 11,
wherein said controlling section records appropriate transfer characteristics, included in said updated transfer characteristics, of said error elimination loop and said error detection loop and applies them as said appropriate transfer characteristics which are given in advance.

13. The linear amplifier according to claim 11, further comprising:
a level monitoring section for monitoring a level of the principal signal inputted to said error detection loop and/or a level of the principal signal obtained via said error elimination loop; and
a storage section for storing transfer characteristics to be set for said error detection loop and said error elimination loop according to the level(s) of said principal signal, and wherein
said controlling section applies the transfer characteristics, which are stored in said storage section according to the level(s) monitored by said level monitoring section, as the appropriate transfer characteristic(s) for said error detection loop and/or said error elimination loop.

14. The linear amplifier according to claim 13,
wherein said controlling section stores in said storage section the appropriate transfer characteristics, included in said updated transfer characteristics, for said error detection loop and said error elimination loop according to the level(s) monitored by said level monitoring section.

15. The linear amplifier according to claim 11, further comprising:
a temperature monitoring section for monitoring a temperature of said amplifying section or a place thermally connected to said amplifying section; and
a storage section for storing transfer characteristics to be set for said error detection loop and said error elimination loop according to said temperature(s), and wherein
said controlling section applies the transfer characteristics which are stored in said storage section according to the temperature(s) monitored by said temperature monitoring section as the appropriate transfer characteristic(s) for said error detection loop and/or said error elimination loop.

16. The linear amplifier according to claim 15,
wherein said controlling section stores in said storage section the appropriate transfer characteristics, included in said updated transfer characteristics, for said error detection loop and said error elimination loop according to the temperature(s) monitored by said temperature monitoring section.

17. The linear amplifier according to claim 11,
wherein said controlling section applies said appropriate transfer characteristics in place of a new transfer characteristics to be updated, when a deviation of the new transfer characteristic to said appropriate transfer characteristic exceed a predetermined upper limit value.

18. The linear amplifier according to claim 11, wherein
said controlling section determines initial values for each of a plurality of items whose cross-correlation is low and which gives the transfer characteristics of said error detection loop and said error elimination loop as a value at which the level of the pilot signal extracted by said monitoring section becomes minimum, by scanning each of said initial values while fixing values of other items at predetermined values, and applies a combination of the initial values as the appropriate transfer characteristics.

19. The linear amplifier according to claim 18, further comprising
a level adjusting section for setting a level of said principal signal at a low value at which the distortion occurring in said amplifying section is reduced, during a period in which each of said initial values of said plurality of items are obtained by said controlling section.

20. The linear amplifier according to claim 19, further comprising
a correction value storage section for storing in advance correction values to be applied in correcting
a difference between levels of the principal signals amplified by said amplifying section, said difference which could occur between a level during the period in which the individual initial values of said plurality of items are obtained by said controlling section and a level after said period is over, and
a margin between errors in the transfer characteristics of said error detection loop and said error elimination loop which occur individually according to the difference in said levels and a characteristic of said amplifying section, and wherein said controlling section corrects the initial values of said plurality of items according to an actual value of said difference in the levels, by using the correction values which are stored in said correction value storage section.

21. A linear amplifier comprising:

a pilot signal superimposing section for superimposing a pilot signal with a known frequency on an inputted principal signal;

an amplifying section
   for amplifying the principal signal on which said pilot signal is superimposed by said pilot signal superimposing section, and
   which maintains linearity based on a feed-forward technique, under adaptive control which minimizes a component of the pilot signal obtained at an output end thereof;

a level monitoring section for monitoring a level of said inputted principal signal; and a controlling section for restricting superimposition of the pilot signal done by said pilot signal superimposing section during a period in which the level of the principal signal monitored by said level monitoring section is lower than a predetermined lower limit value.

22. A linear amplifier comprising:

a pilot signal superimposing section for superimposing a pilot signal with a known frequency on an inputted principal signal;

an amplifying section
   for amplifying the principal signal on which said pilot signal is superimposed by said pilot signal superimposing section, and
   which maintains linearity based on a feed-forward technique, under adaptive control which minimizes a component of the pilot signal obtained at an output end thereof; and a controlling section for restricting, according to a notice indicating a period in which a level of said inputted principal signal is lower than a predetermined lower limit value, superimposition of the pilot signal done by said pilot signal superimposing section during the period.

* * * * *